United States Patent
Masuoka et al.

(10) Patent No.: US 9,865,741 B2
(45) Date of Patent: *Jan. 9, 2018

(54) METHOD FOR PRODUCING SEMICONDUCTOR DEVICE AND SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/191,711

(22) Filed: Jun. 24, 2016

(65) Prior Publication Data
US 2016/0308065 A1    Oct. 20, 2016

Related U.S. Application Data

(63) Continuation of application No. PCT/JP2014/055667, filed on Mar. 5, 2014.

(51) Int. Cl.
*H01L 21/00* (2006.01)
*H01L 29/786* (2006.01)
(Continued)

(52) U.S. Cl.
CPC .......... *H01L 29/78642* (2013.01); *H01L 21/823487* (2013.01); *H01L 29/42392* (2013.01);
(Continued)

(58) Field of Classification Search
CPC ......... H01L 29/78642; H01L 29/42392; H01L 29/66545
See application file for complete search history.

(56) References Cited

U.S. PATENT DOCUMENTS

| 5,258,635 A | 11/1993 | Nitayama et al. |
| 8,026,141 B2 * | 9/2011 | Masuoka ............... H01L 22/26 |
| | | 438/268 |

(Continued)

FOREIGN PATENT DOCUMENTS

| JP | 02071556 A | 3/1990 |
| JP | 02188966 A | 7/1990 |

(Continued)

OTHER PUBLICATIONS

C.C. Wu, et al., "High Performance 22/20nm FinFET SMOS Devices with Advanced High-K/Metal Gate Scheme", 2010 IEEE International Electron Devices Meeting (IEDM), 2010, pp. 27.1.1-27.1.4, San Francisco, CA.

(Continued)

*Primary Examiner* — Laura Menz
(74) *Attorney, Agent, or Firm* — Brinks Gilson & Lione

(57) ABSTRACT

A method for producing a semiconductor device includes a first step of forming a first insulating film around a fin-shaped semiconductor layer on a semiconductor substrate; a second step of forming a second insulating film, depositing a first polysilicon, planarizing the first polysilicon, forming a third insulating film, forming a second resist, and forming a pillar-shaped semiconductor layer, a first dummy gate, and a first hard mask; and a third step of forming a fourth insulating film, depositing a second polysilicon, planarizing the second polysilicon, etching back the second polysilicon, depositing a sixth insulating film, forming a fourth resist, forming a second hard mask, forming a third hard mask, (Continued)

forming a second dummy gate, and forming a first dummy contact on the fin-shaped semiconductor layer.

4 Claims, 46 Drawing Sheets

(51) Int. Cl.
  *H01L 21/8234* (2006.01)
  *H01L 29/423* (2006.01)
  *H01L 29/66* (2006.01)
(52) U.S. Cl.
  CPC .. *H01L 29/66545* (2013.01); *H01L 29/66666* (2013.01); *H01L 29/78618* (2013.01); *H01L 29/78696* (2013.01)

(56) References Cited

U.S. PATENT DOCUMENTS

| | | | | |
|---|---|---|---|---|
| 8,080,458 B2* | 12/2011 | Masuoka | ........... | H01L 29/42356 257/E21.41 |
| 8,212,311 B2* | 7/2012 | Masuoka | ......... | H01L 21/823828 257/329 |
| 8,372,713 B2* | 2/2013 | Masuoka | ............ | H01L 27/0207 257/329 |
| 8,497,548 B2* | 7/2013 | Masuoka | ......... | H01L 21/823885 257/329 |
| 8,563,379 B2 | 10/2013 | Masuoka et al. | | |
| 8,647,947 B2* | 2/2014 | Masuoka | ......... | H01L 21/823885 257/329 |
| 8,901,640 B2* | 12/2014 | Masuoka | ......... | H01L 21/823431 257/328 |
| 9,646,991 B2* | 5/2017 | Masuoka | ........... | H01L 29/66666 |
| 9,716,092 B2* | 7/2017 | Masuoka | .............. | H01L 27/092 |
| 9,748,244 B2* | 8/2017 | Masuoka | ............ | H01L 27/0924 |
| 2009/0065860 A1 | 3/2009 | Mikasa | | |
| 2010/0087017 A1* | 4/2010 | Masuoka | ................. | H01L 22/26 438/9 |
| 2010/0207201 A1* | 8/2010 | Masuoka | ............ | H01L 27/0207 257/329 |
| 2010/0210096 A1* | 8/2010 | Masuoka | ......... | H01L 21/823885 438/585 |
| 2010/0213525 A1* | 8/2010 | Masuoka | ......... | H01L 21/823828 257/306 |
| 2010/0213539 A1* | 8/2010 | Masuoka | ................ | H01L 21/84 257/329 |
| 2011/0042740 A1* | 2/2011 | Masuoka | .......... | H01L 21/76804 257/329 |
| 2015/0255598 A1* | 9/2015 | Masuoka | ............ | H01L 29/4238 257/329 |
| 2016/0005764 A1* | 1/2016 | Masuoka | .............. | H01L 27/092 257/329 |
| 2016/0056174 A1* | 2/2016 | Masuoka | .......... | H01L 29/66666 257/203 |
| 2016/0056279 A1* | 2/2016 | Masuoka | .......... | H01L 29/66477 257/386 |
| 2016/0247938 A1* | 8/2016 | Masuoka | ............ | H01L 29/7827 |
| 2016/0308046 A1* | 10/2016 | Masuoka | .......... | H01L 29/66545 |
| 2016/0308065 A1* | 10/2016 | Masuoka | ........ | H01L 21/823487 |
| 2016/0329899 A1* | 11/2016 | Masuoka | ............ | H01L 27/0207 |
| 2016/0336330 A1* | 11/2016 | Masuoka | .............. | H01L 27/115 |
| 2016/0343871 A1* | 11/2016 | Masuoka | ................ | H01L 29/78 |

FOREIGN PATENT DOCUMENTS

| | | | | |
|---|---|---|---|---|
| JP | 03145761 A | 6/1991 | | |
| JP | 2009070975 A | 4/2009 | | |
| JP | 2009182317 A | 8/2009 | | |
| JP | 2011040682 A | 2/2011 | | |
| JP | 2013239622 A | 11/2013 | | |
| JP | 5838530 B1 * | 1/2016 | ..... | H01L 21/823487 |
| WO | 2014024266 A1 | 2/2014 | | |
| WO | WO 2015132912 A1 * | 9/2015 | ..... | H01L 21/823487 |

OTHER PUBLICATIONS

K. Mistry, et al., "A 45nm Logic Technology with Kigh-k+Metal Gate Transistors, Strained Silicon, 9 Cu Interconnect Layers, 193nm Dry Patterning, and 100% Pb-free Packaging", 2007 IEEE International Electron Devices Meeting, 2007, pp. 247-250, Washington, DC, URL: ftp://download.intel.com/pressroom/kits/advancedtech/pdfs/Mistry_IEDM_2007_HiK-MG_paper.pdf.
English language translation of International Preliminary Report on Patentability in corresponding International Application No. PCT/JP2014/055667, dated Sep. 15, 2016, 7 pages.

* cited by examiner

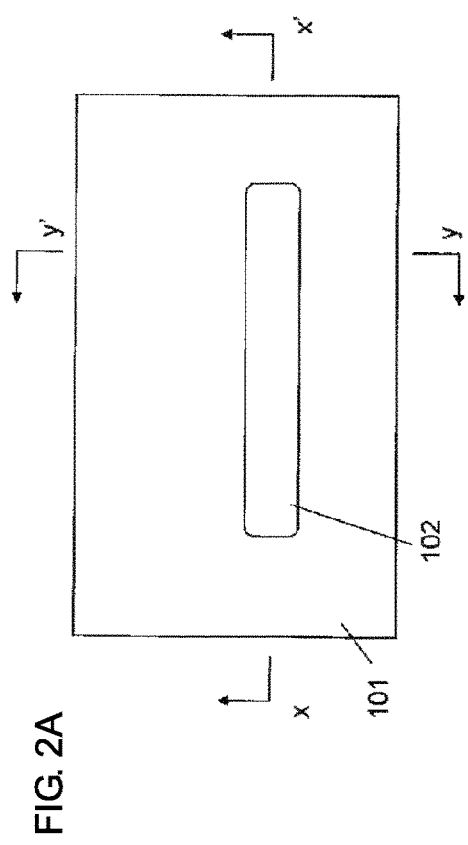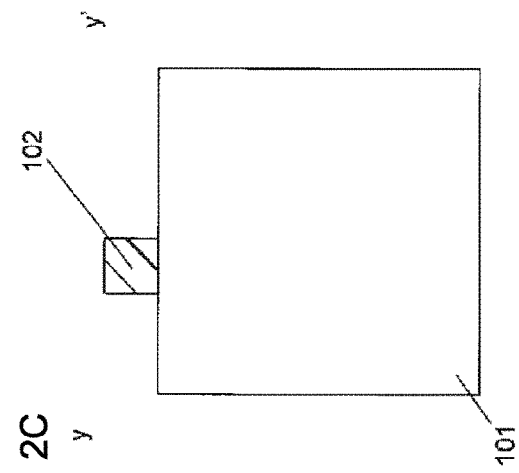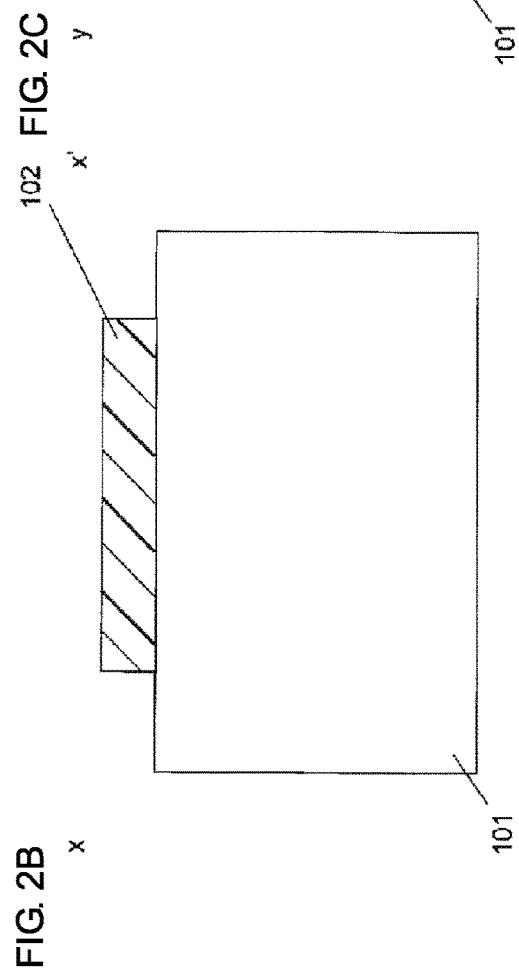

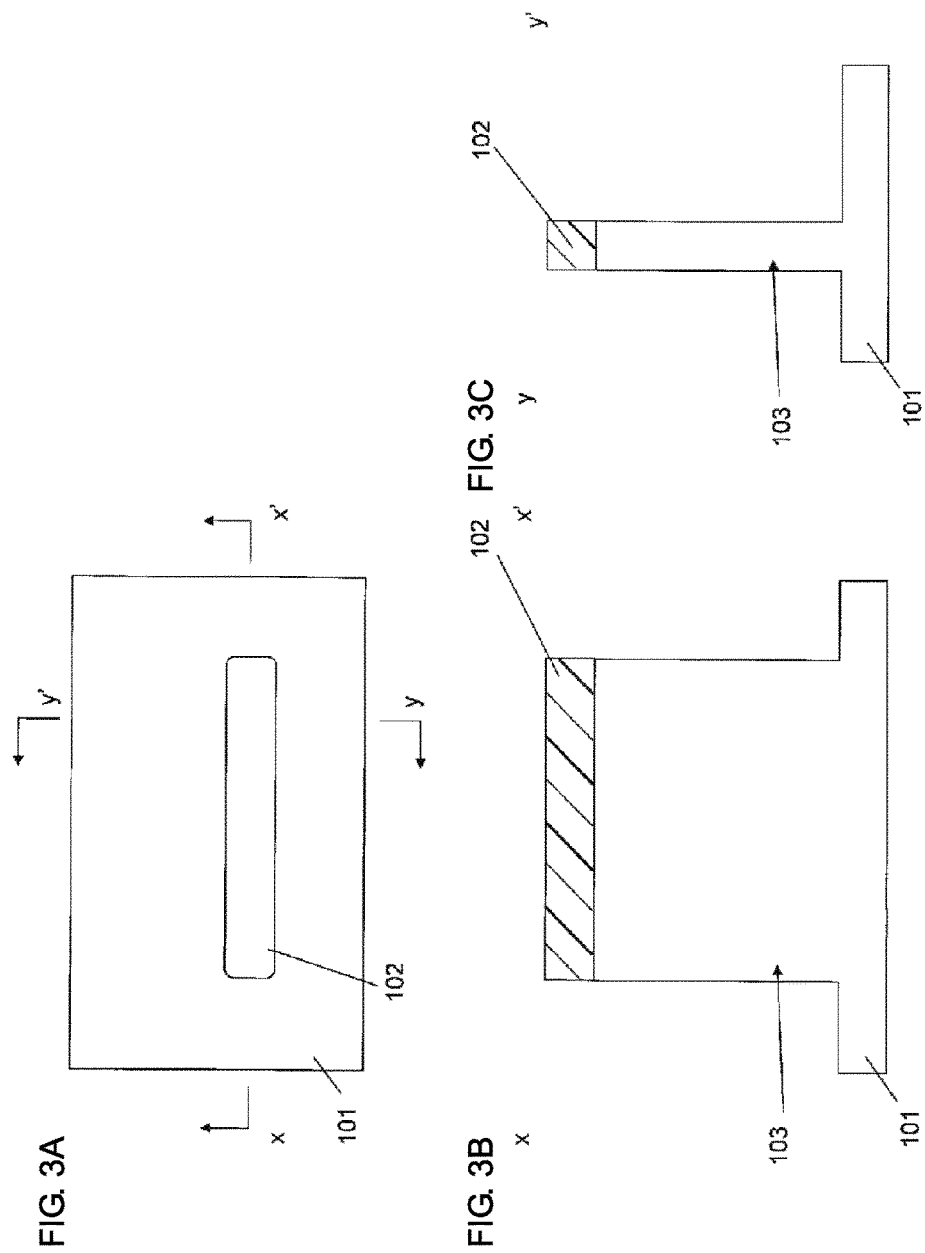

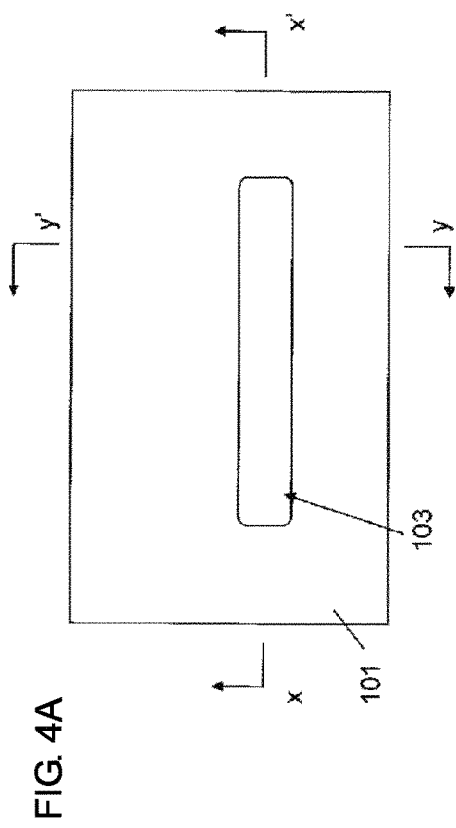
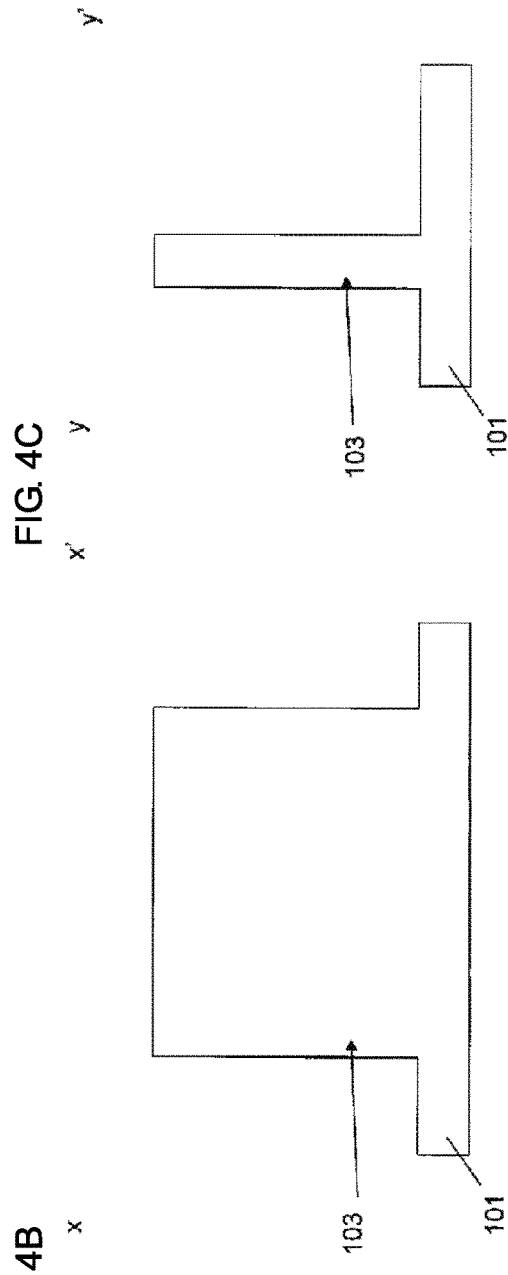
FIG. 4A
FIG. 4B
FIG. 4C

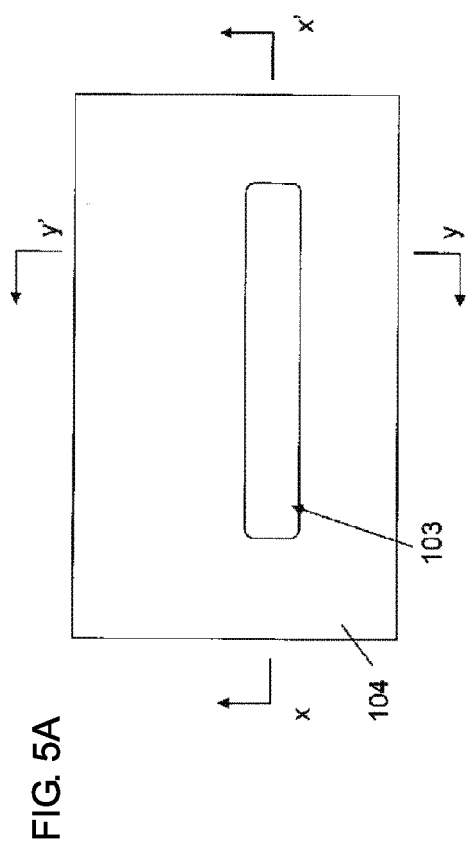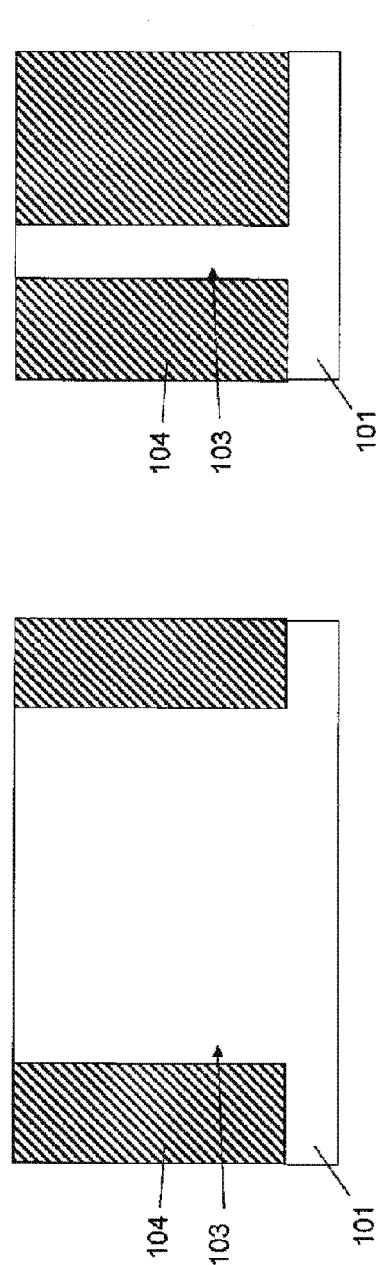
FIG. 5A
FIG. 5B
FIG. 5C

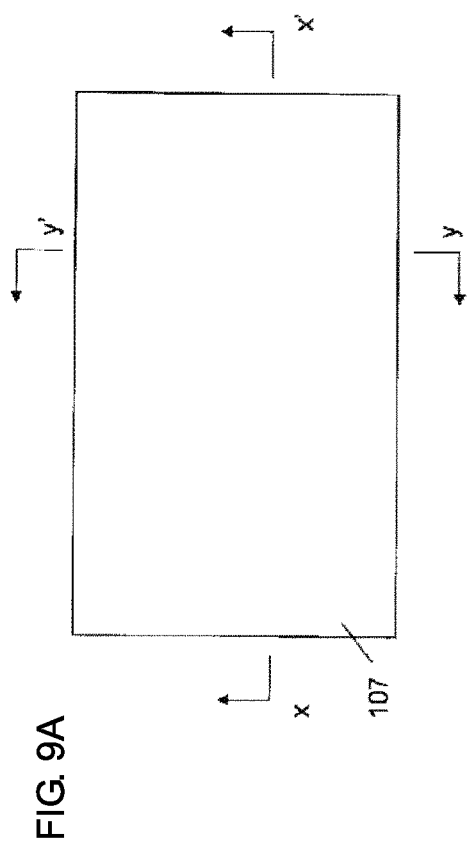
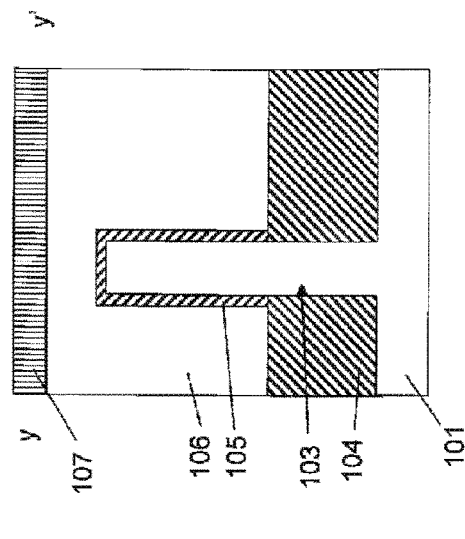
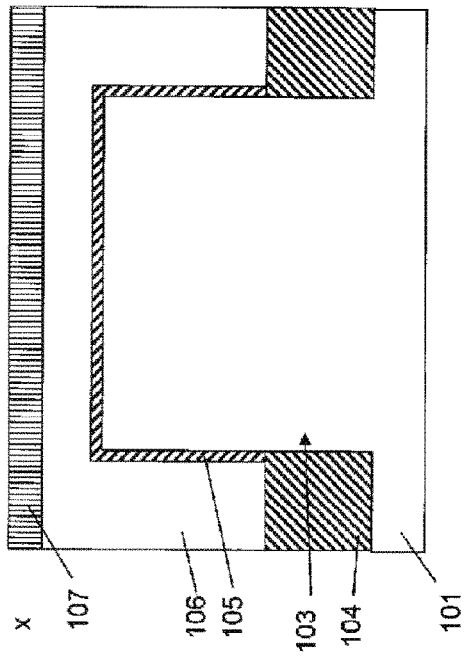
FIG. 9A
FIG. 9B
FIG. 9C

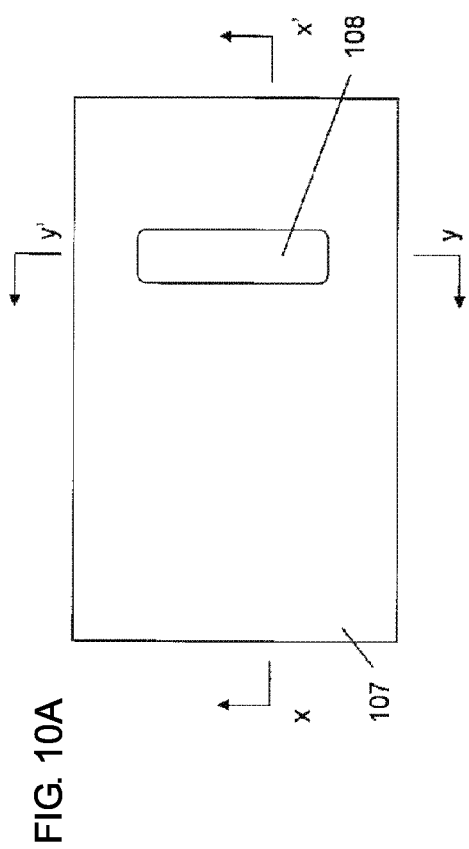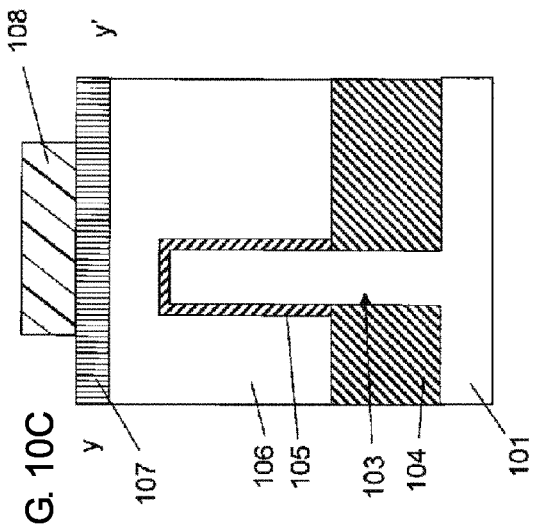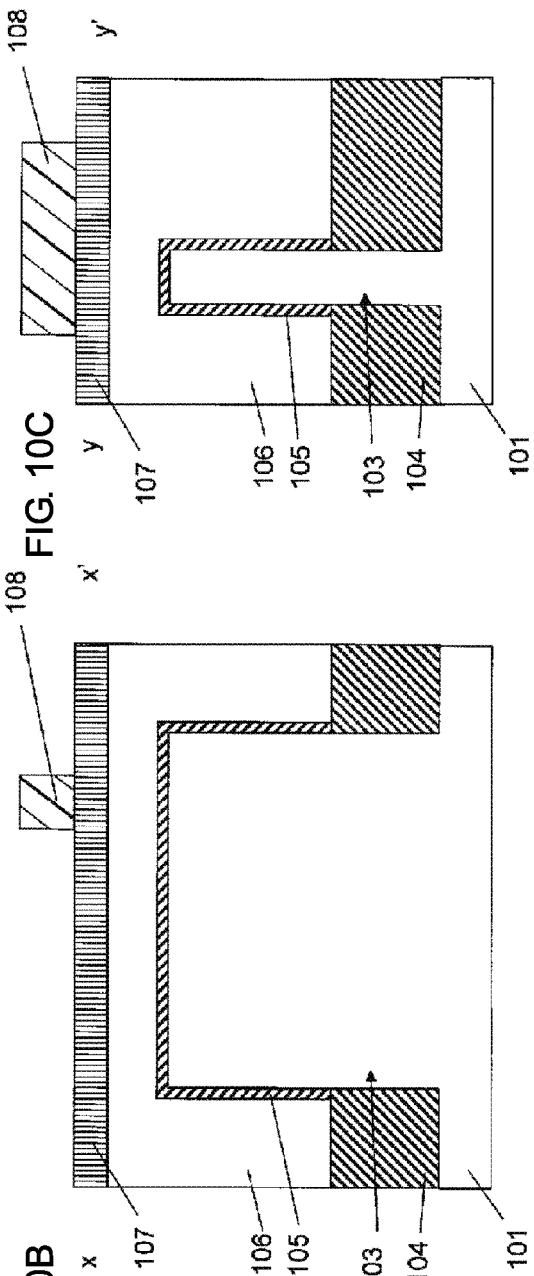

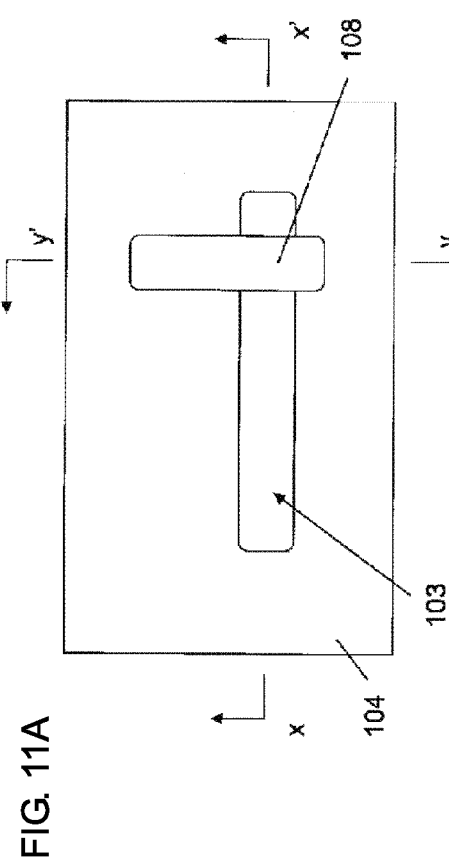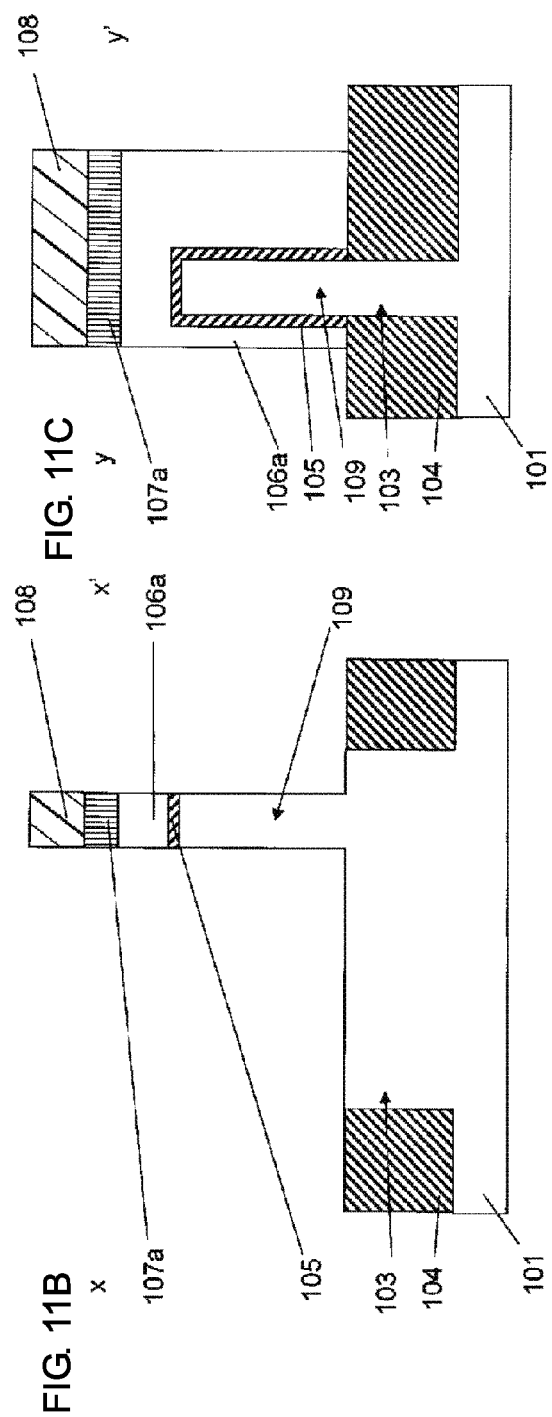

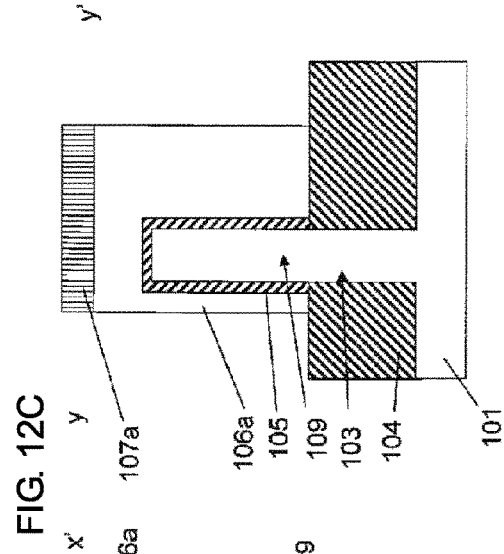
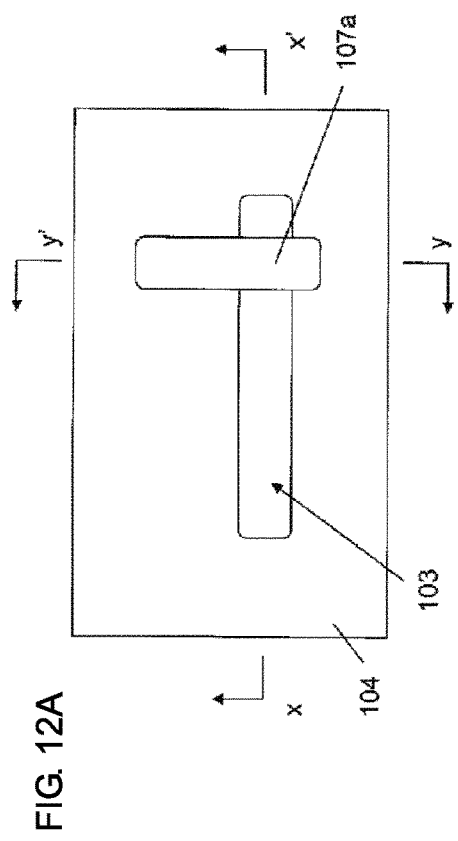
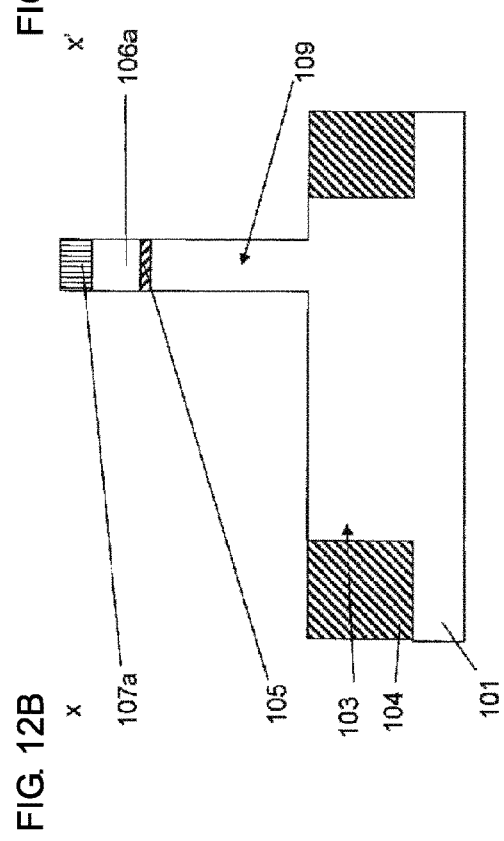
FIG. 12A
FIG. 12B
FIG. 12C

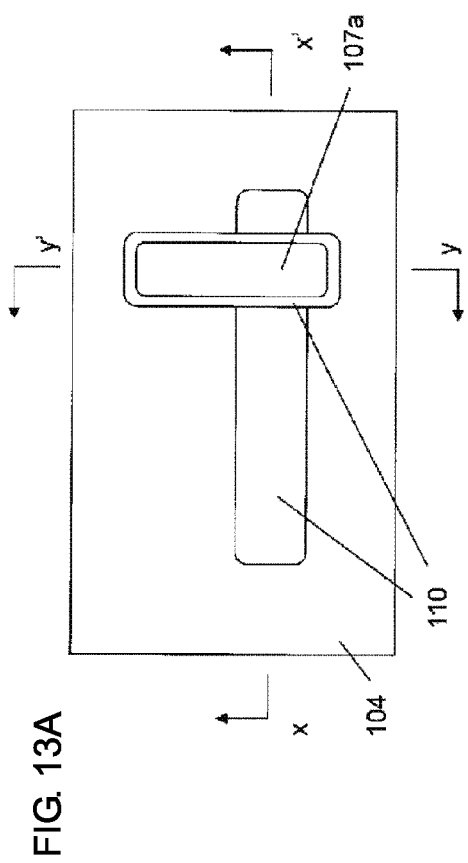
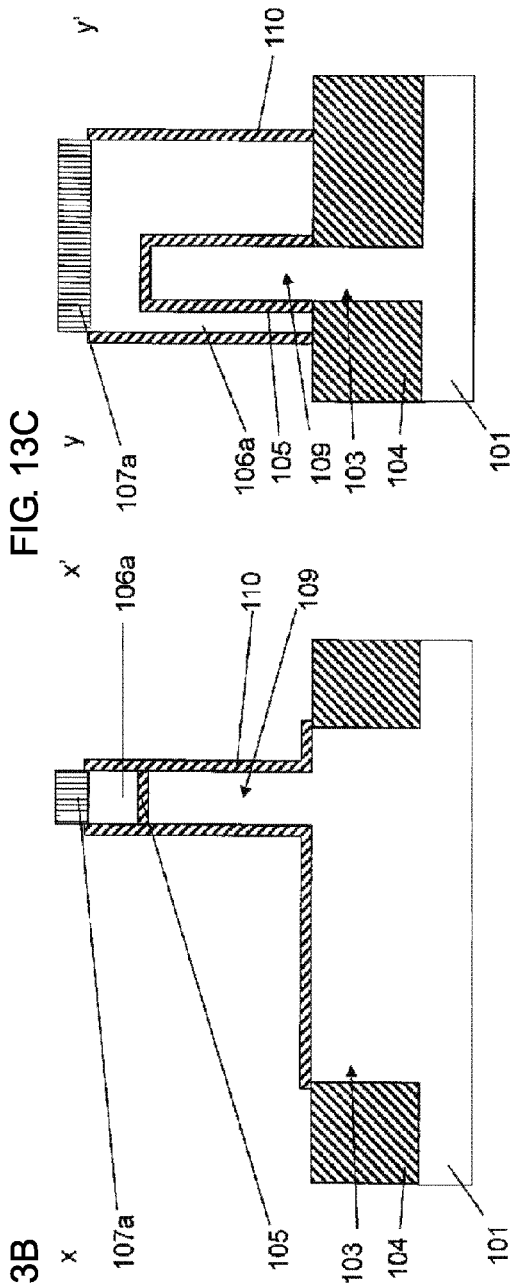
FIG. 13A
FIG. 13B
FIG. 13C

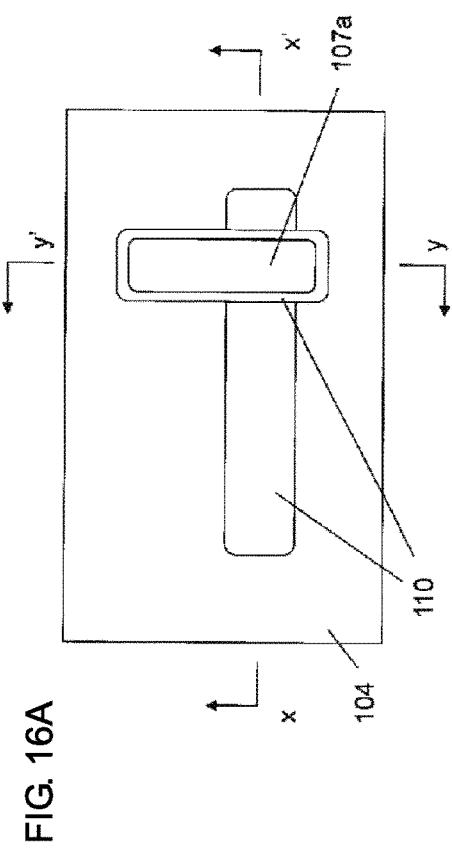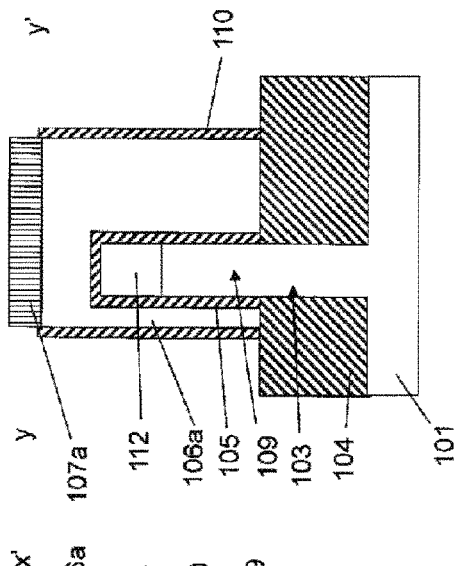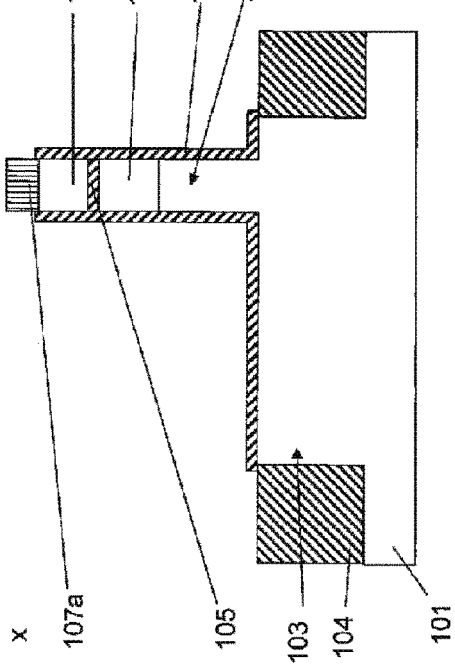

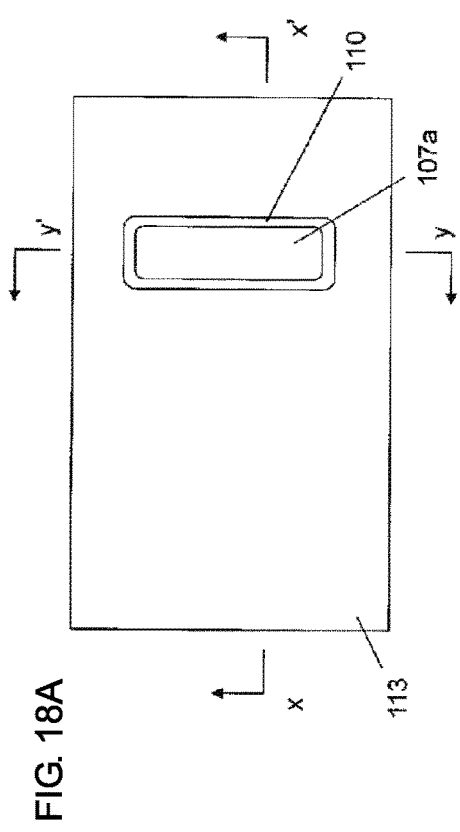
FIG. 18A
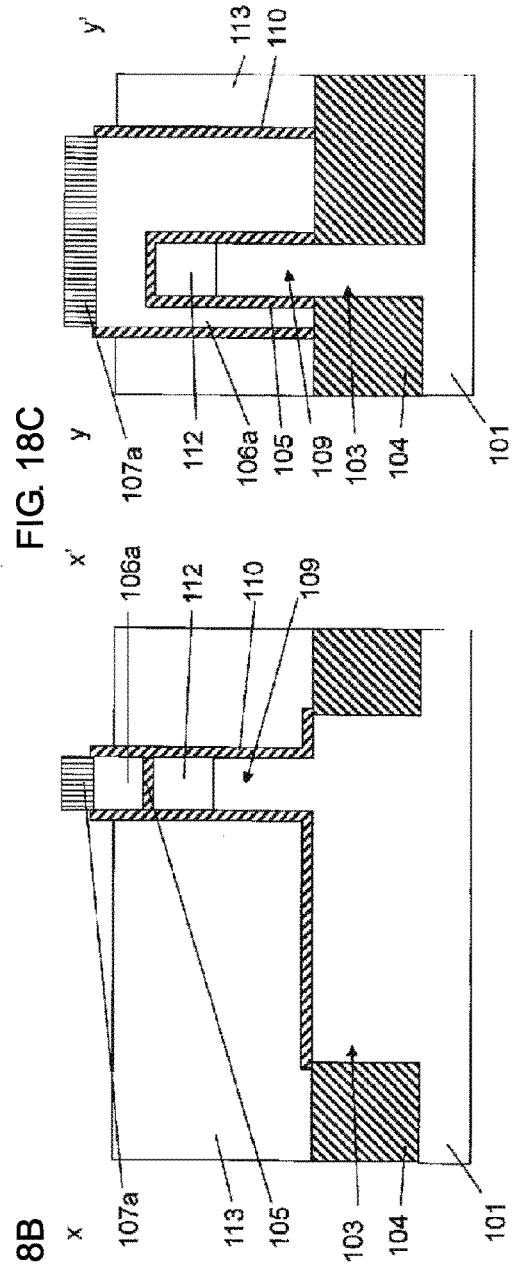
FIG. 18B
FIG. 18C

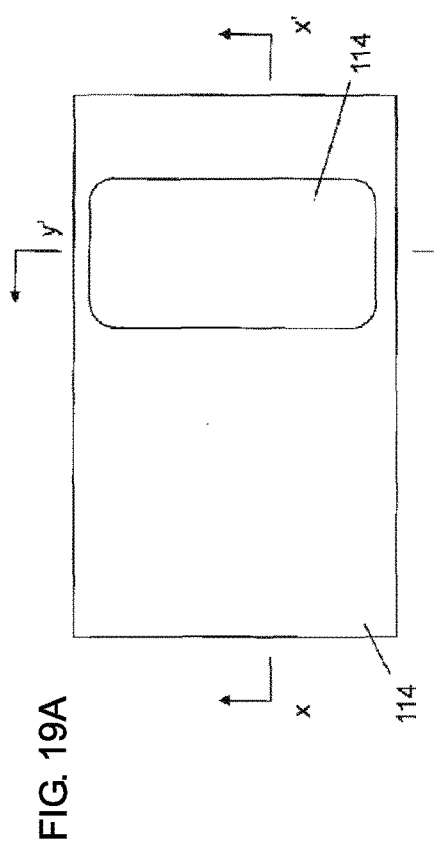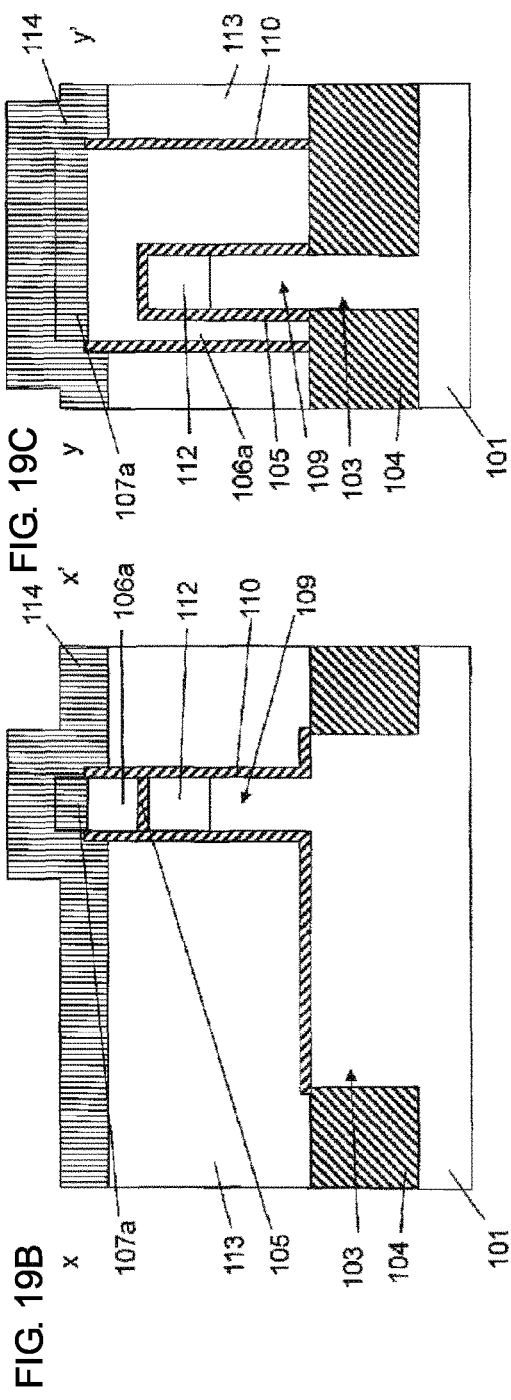

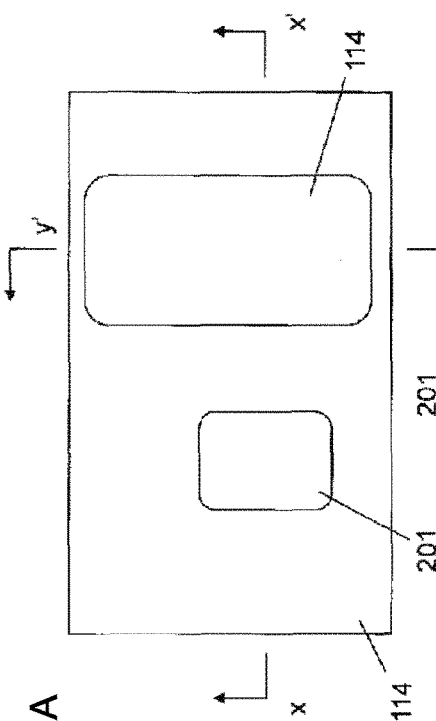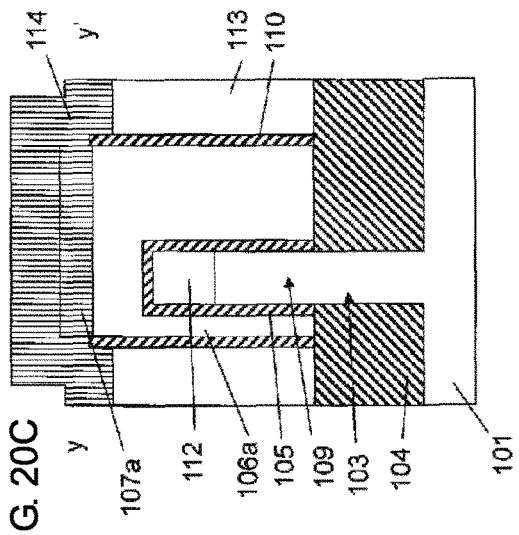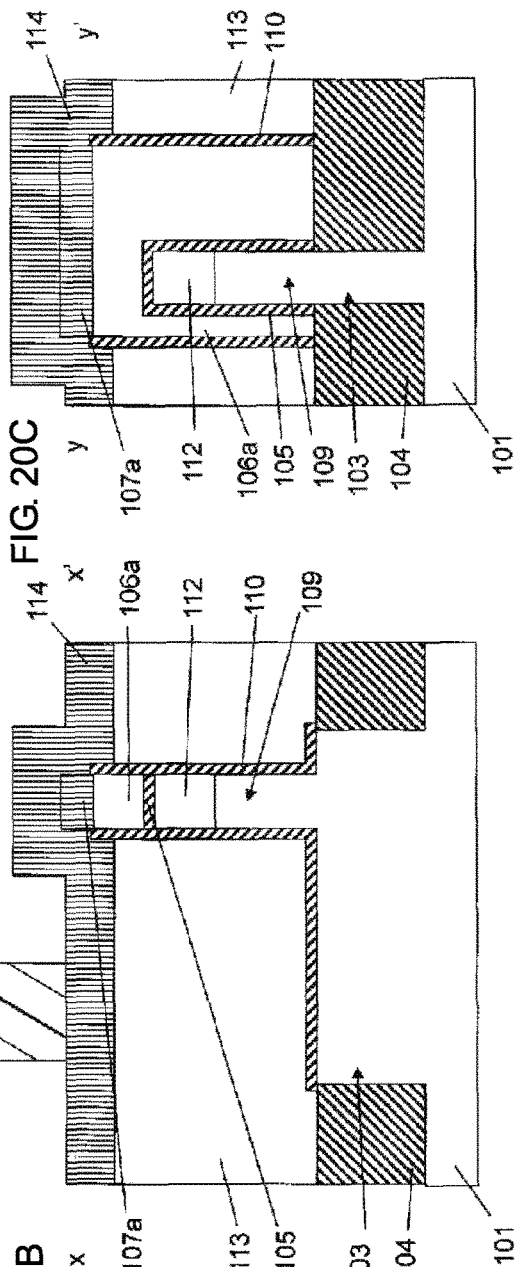
FIG. 20A
FIG. 20B
FIG. 20C

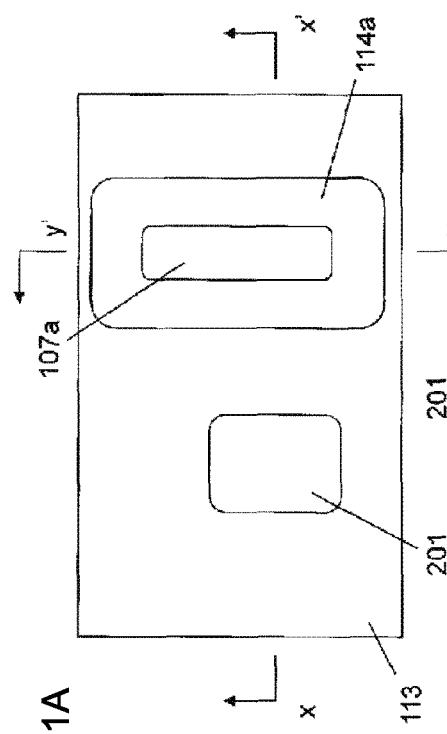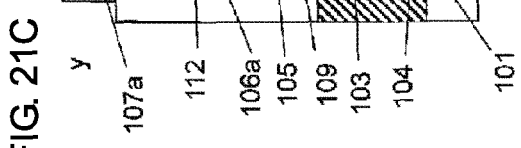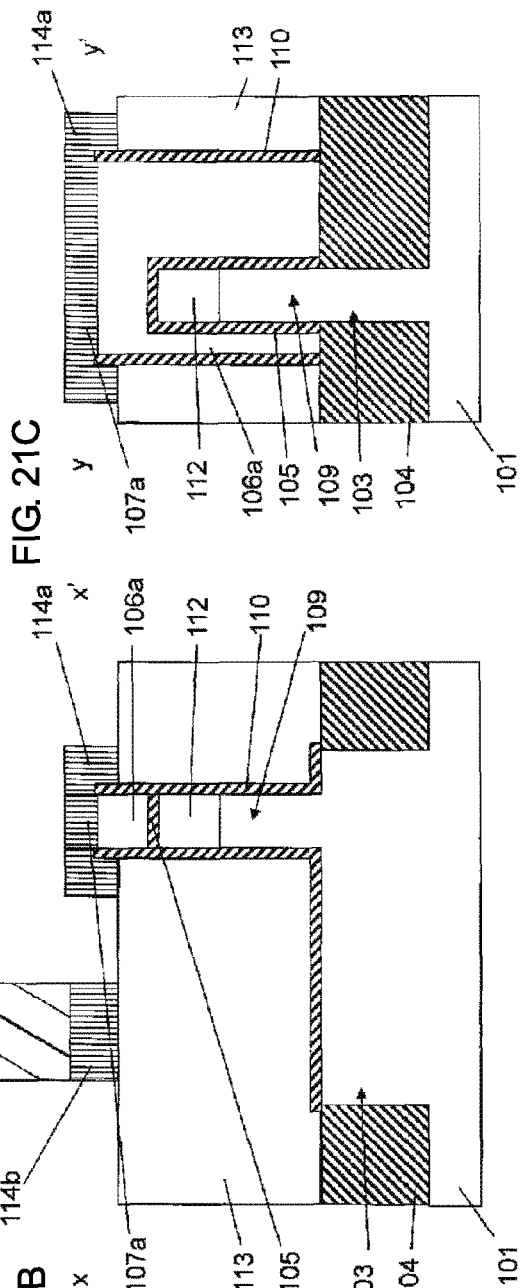
FIG. 21A
FIG. 21B
FIG. 21C

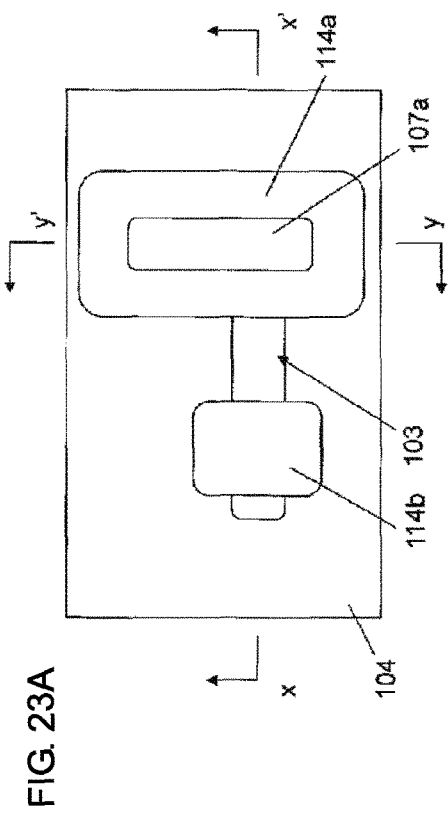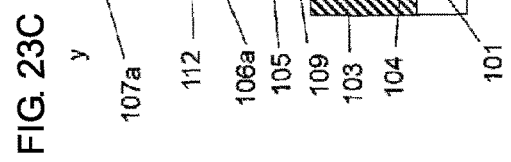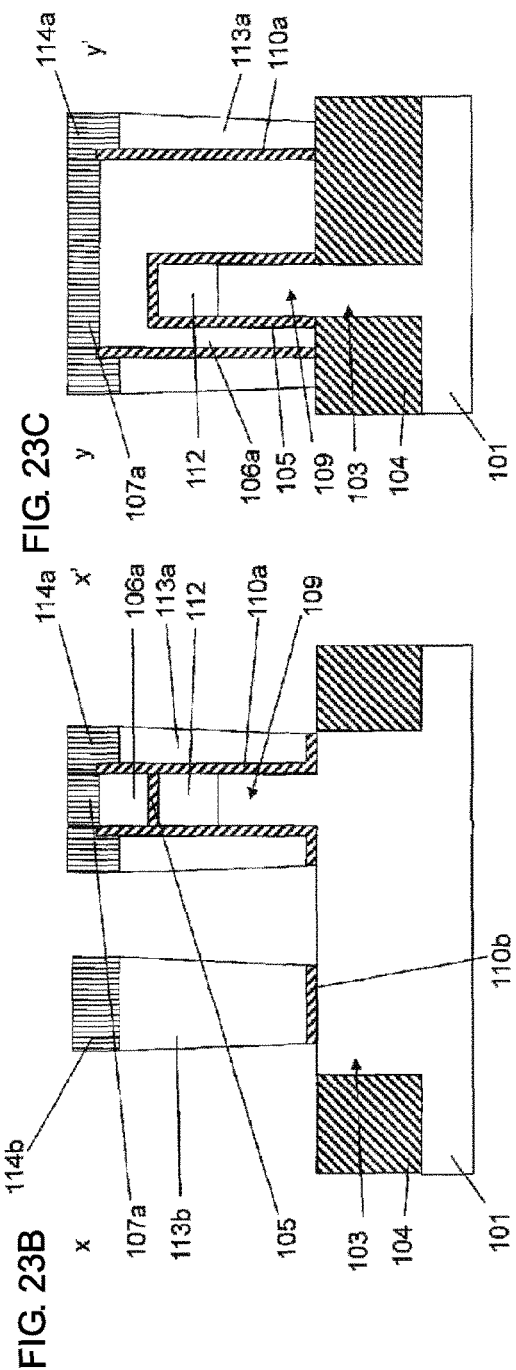

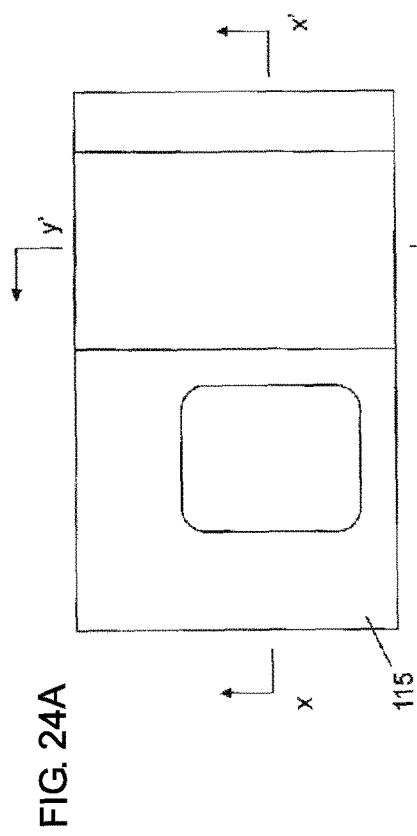
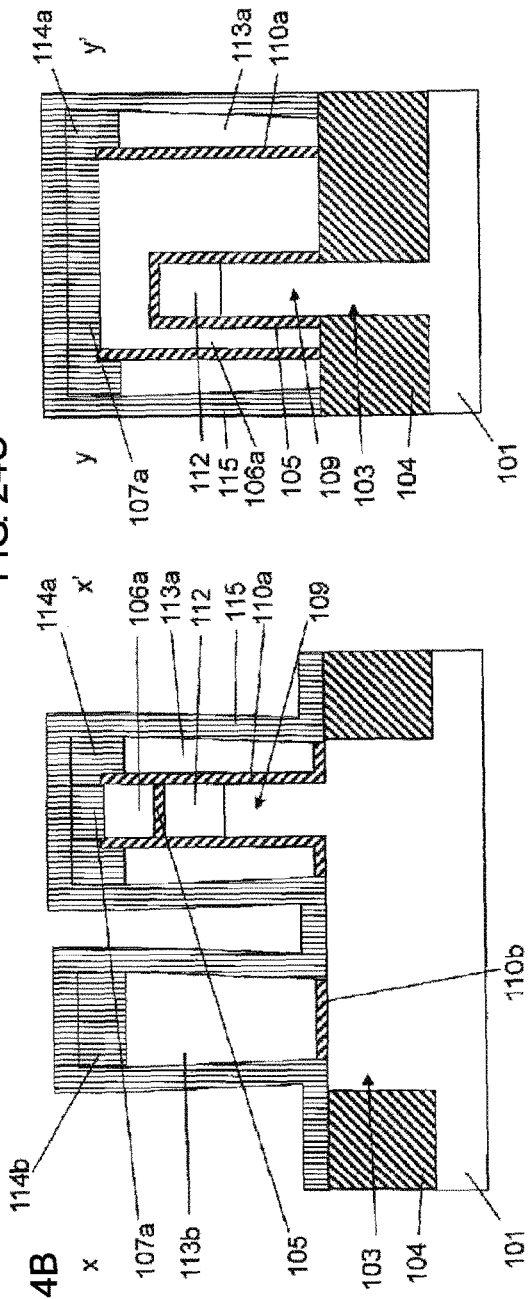
FIG. 24A
FIG. 24B
FIG. 24C

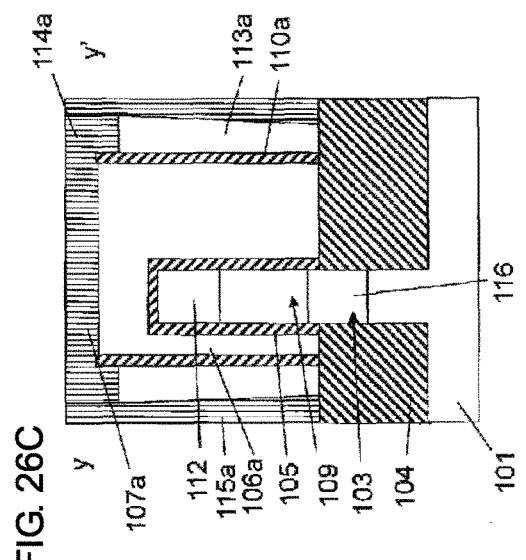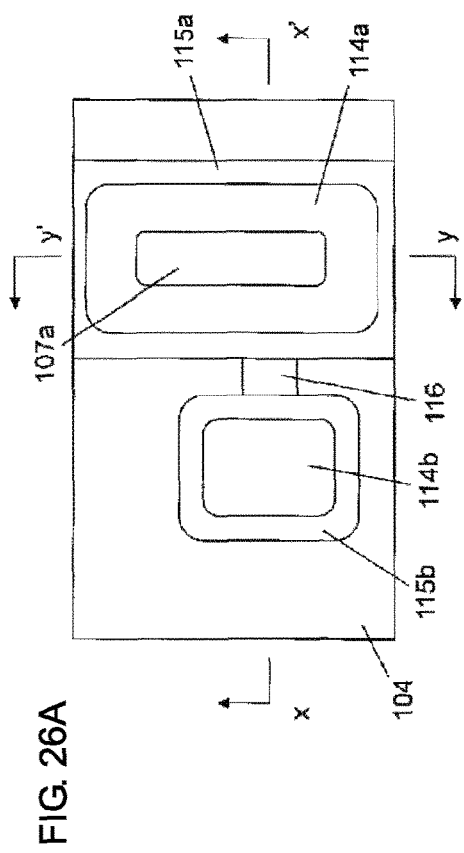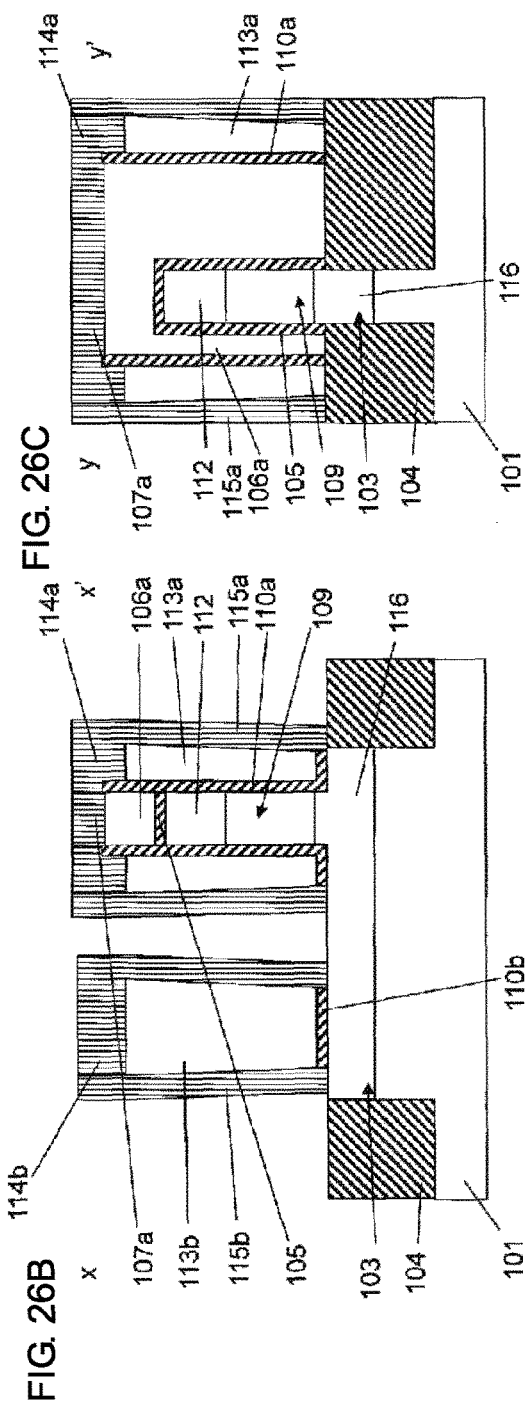

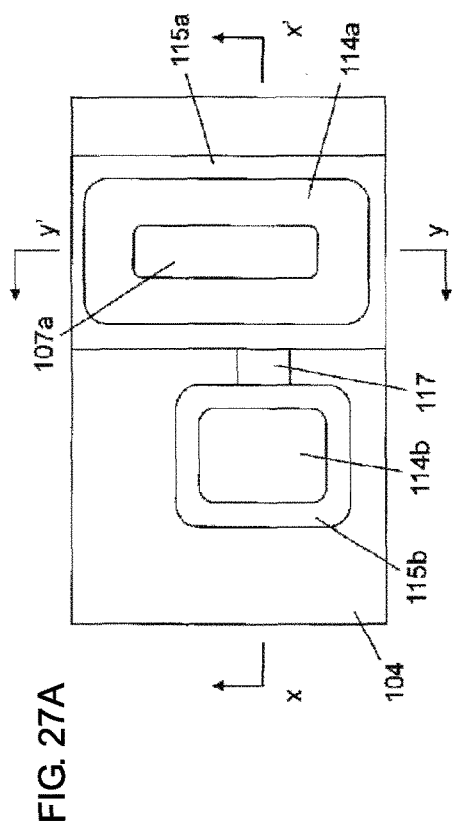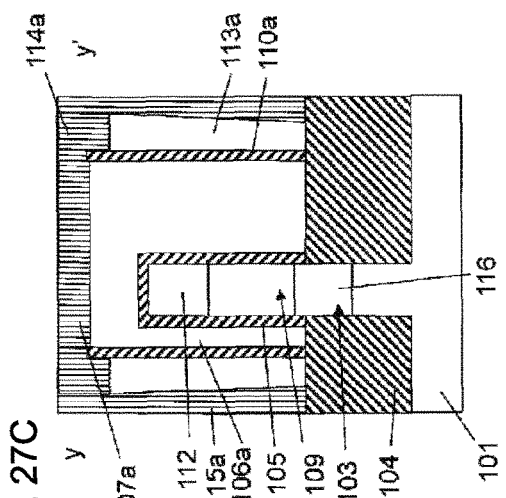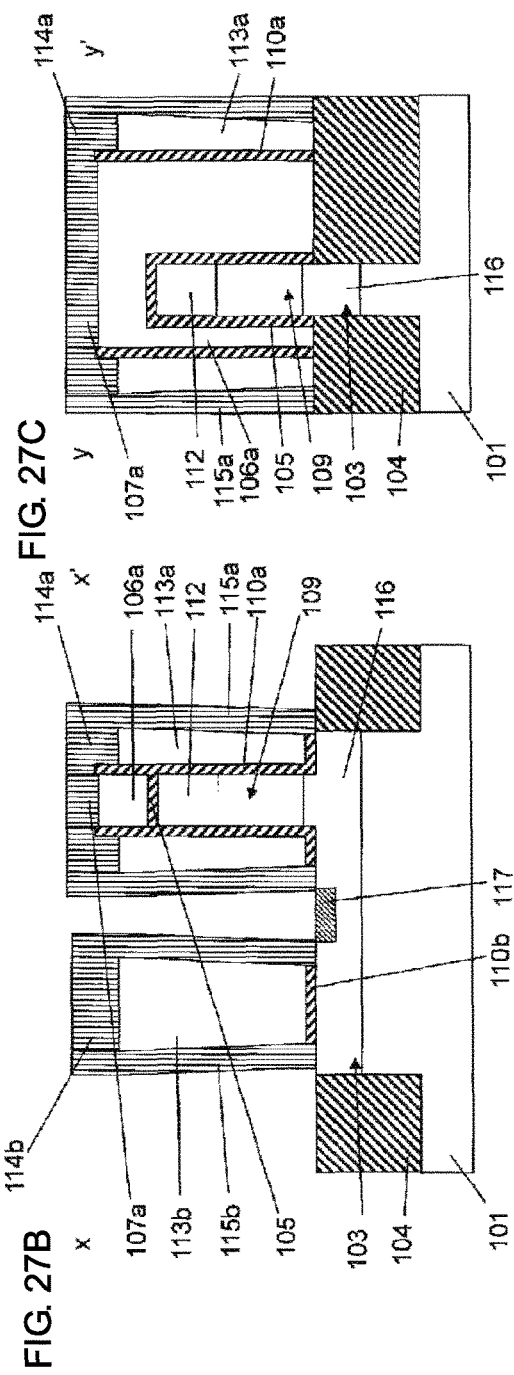
FIG. 27A
FIG. 27B
FIG. 27C

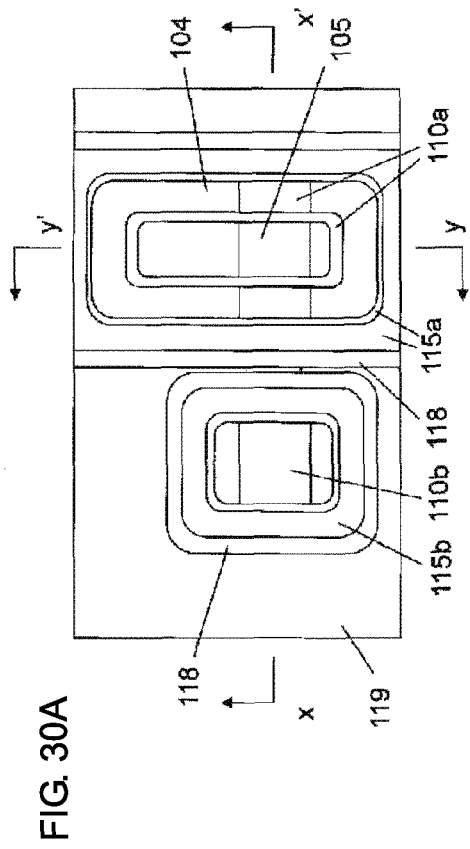
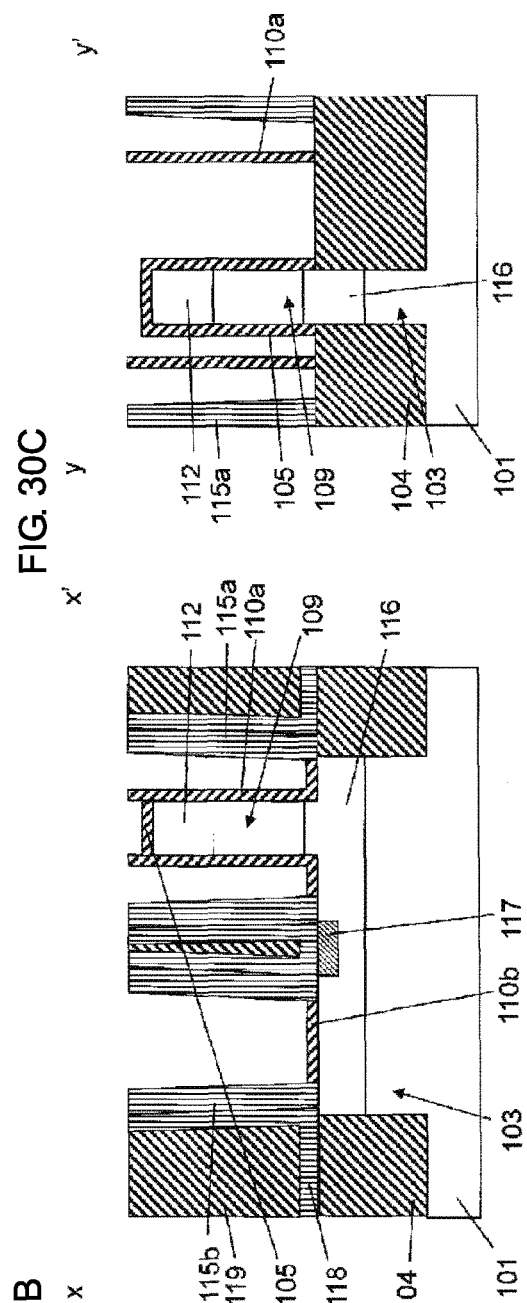
FIG. 30A
FIG. 30B
FIG. 30C

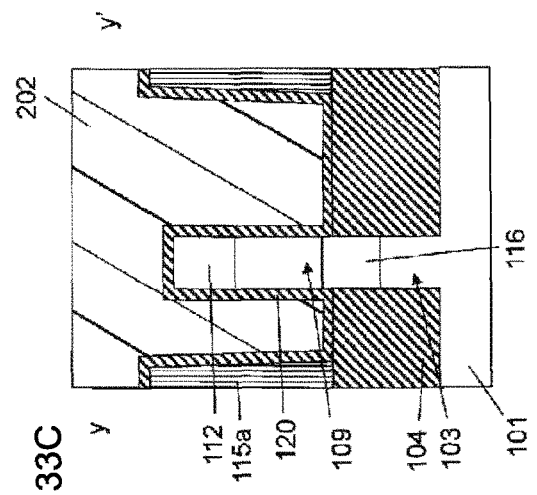
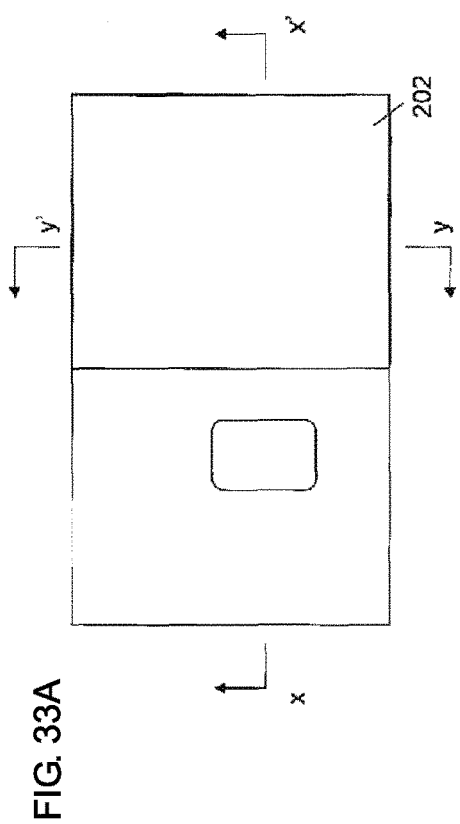
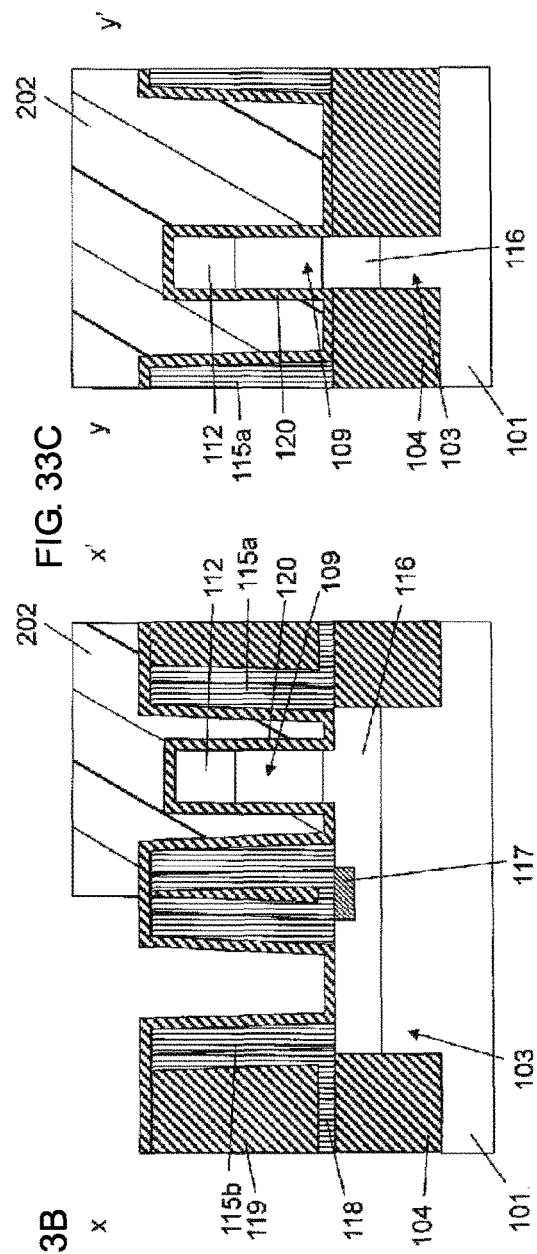
FIG. 33A
FIG. 33B
FIG. 33C

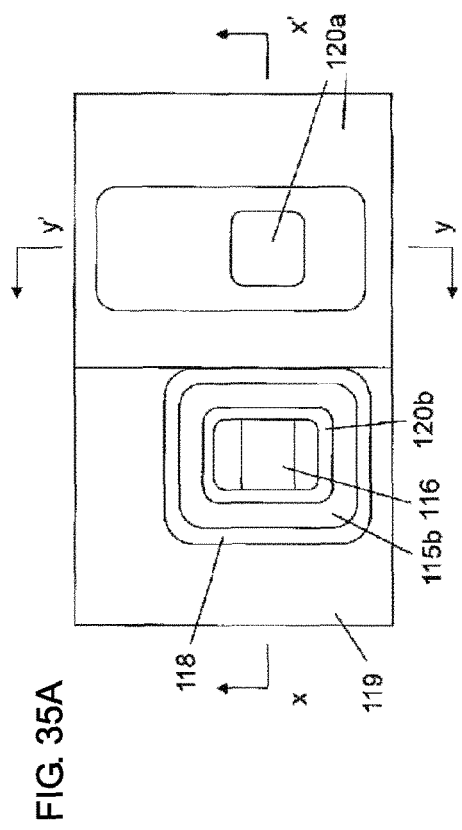
FIG. 35A
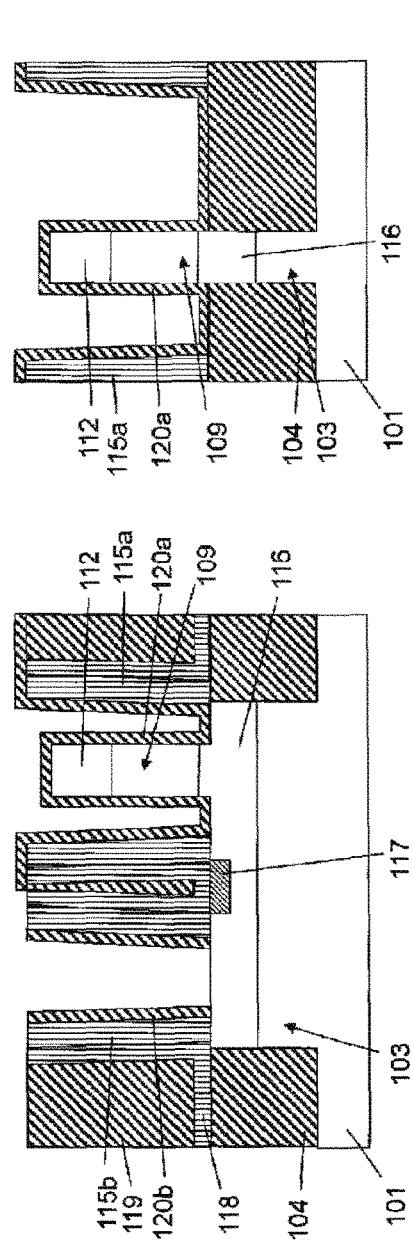
FIG. 35B
FIG. 35C

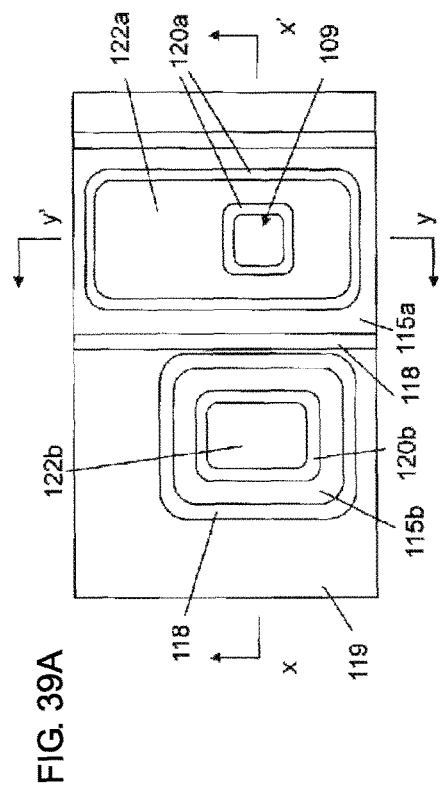
FIG. 39A
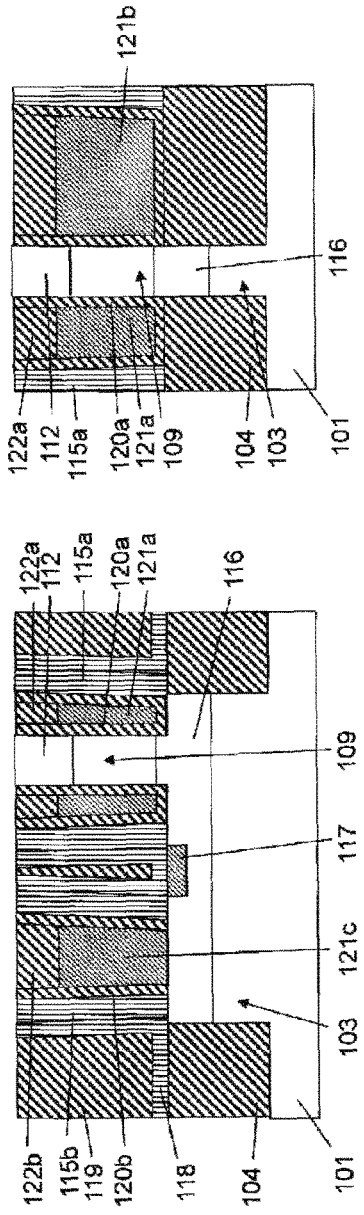
FIG. 39B
FIG. 39C

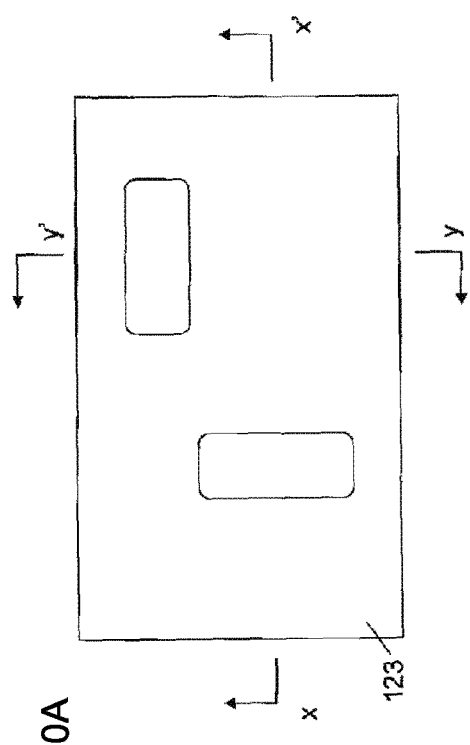
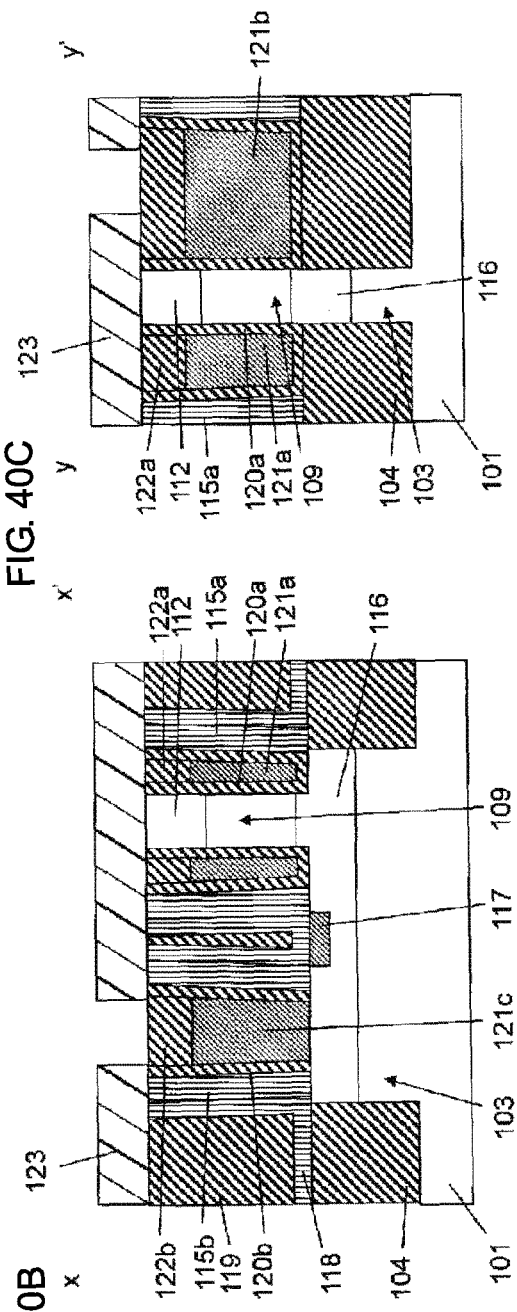
FIG. 40A
FIG. 40B
FIG. 40C

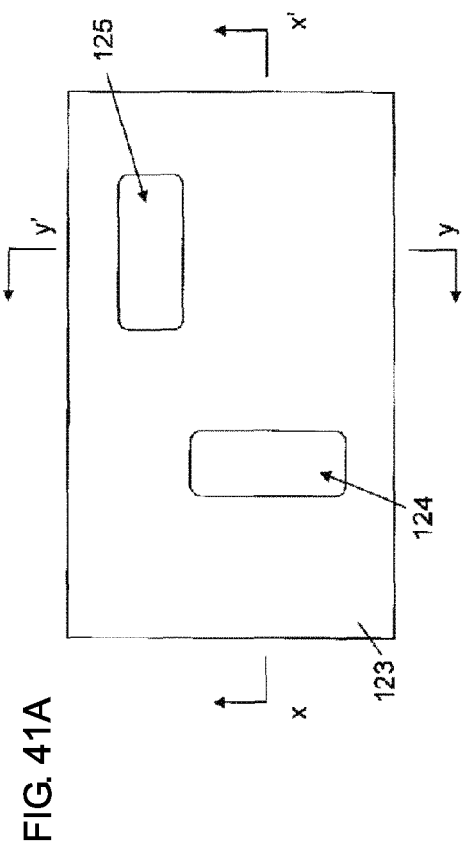
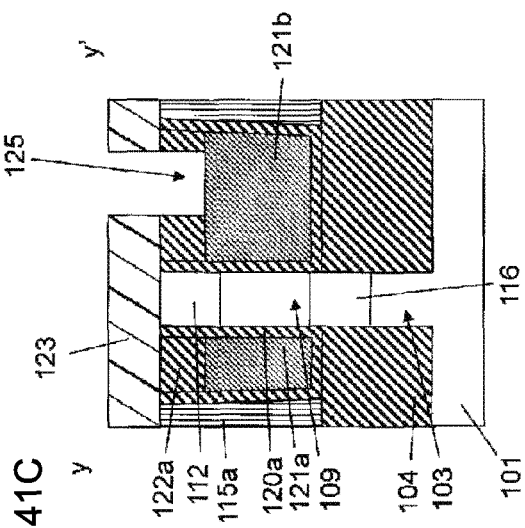
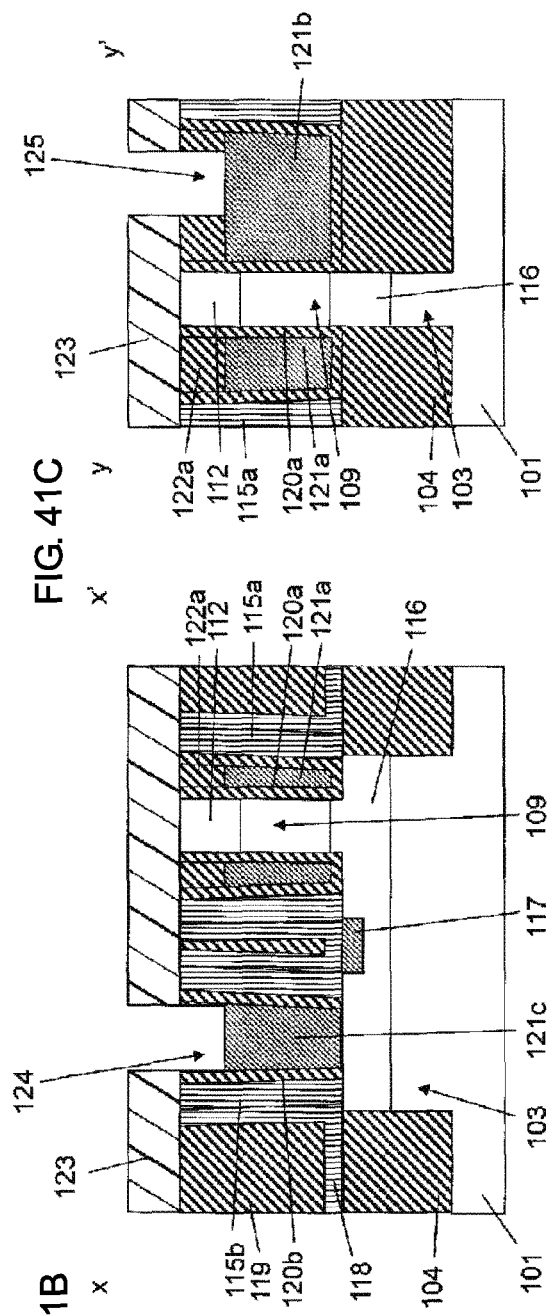
FIG. 41A
FIG. 41C
FIG. 41B

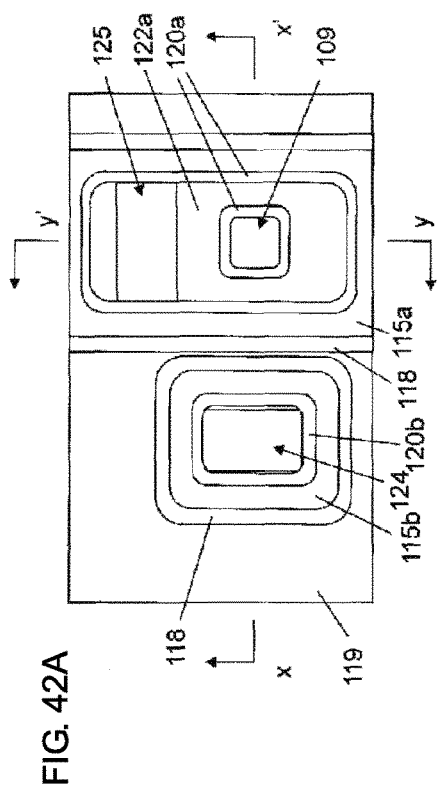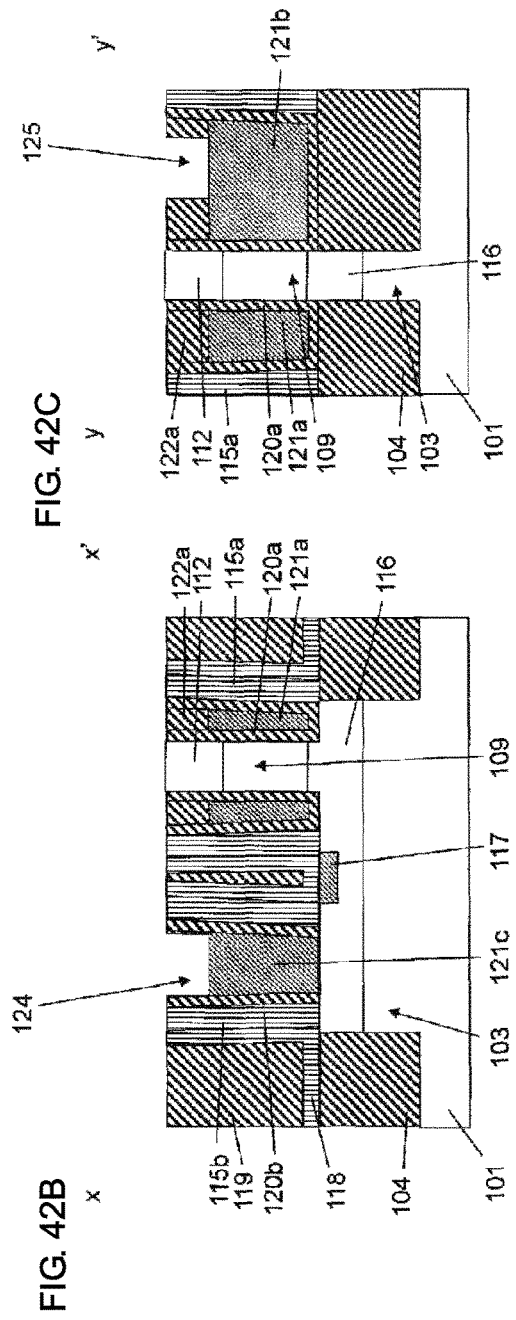
FIG. 42A
FIG. 42B
FIG. 42C

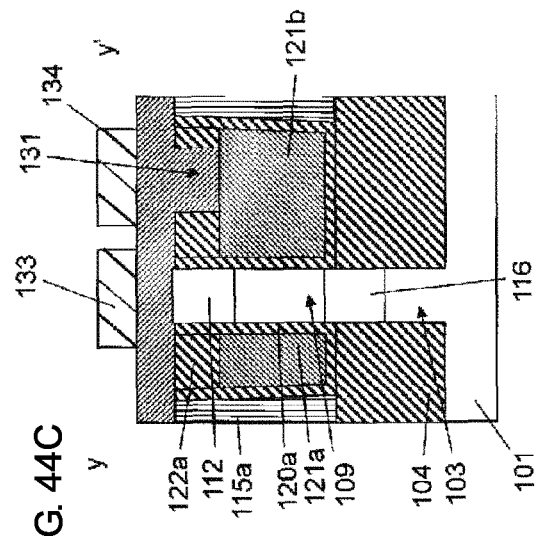
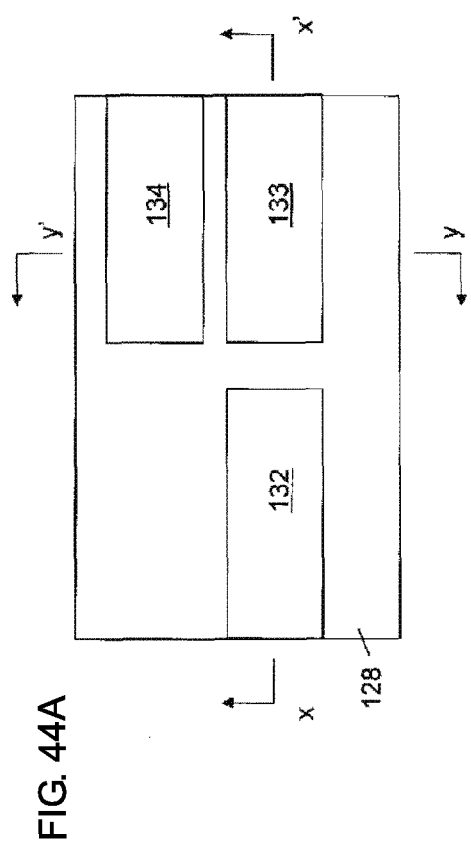
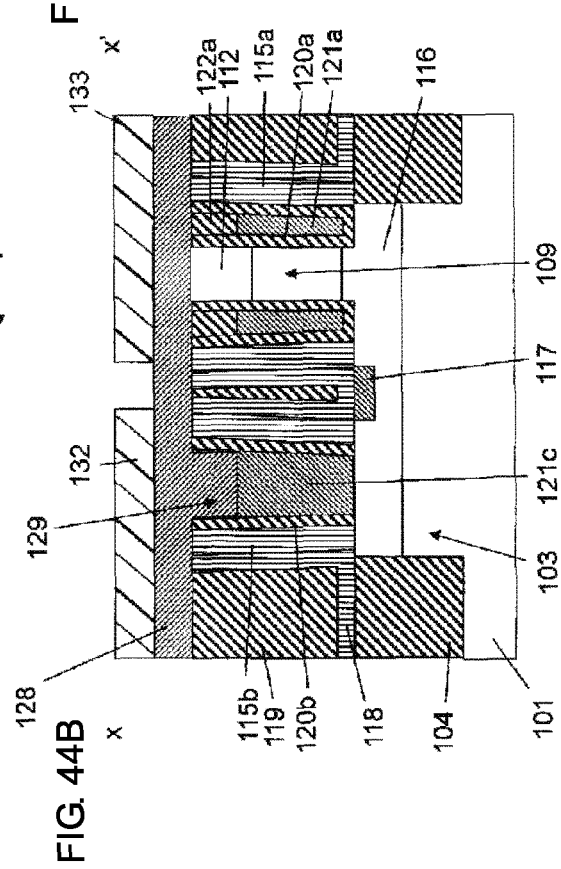
FIG. 44A
FIG. 44B
FIG. 44C

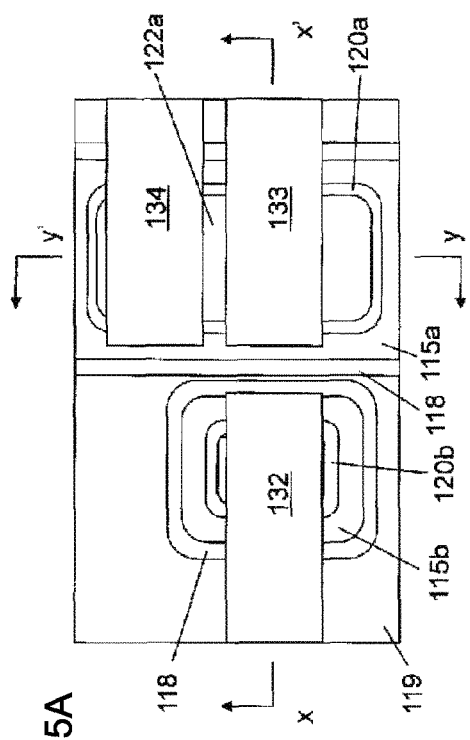
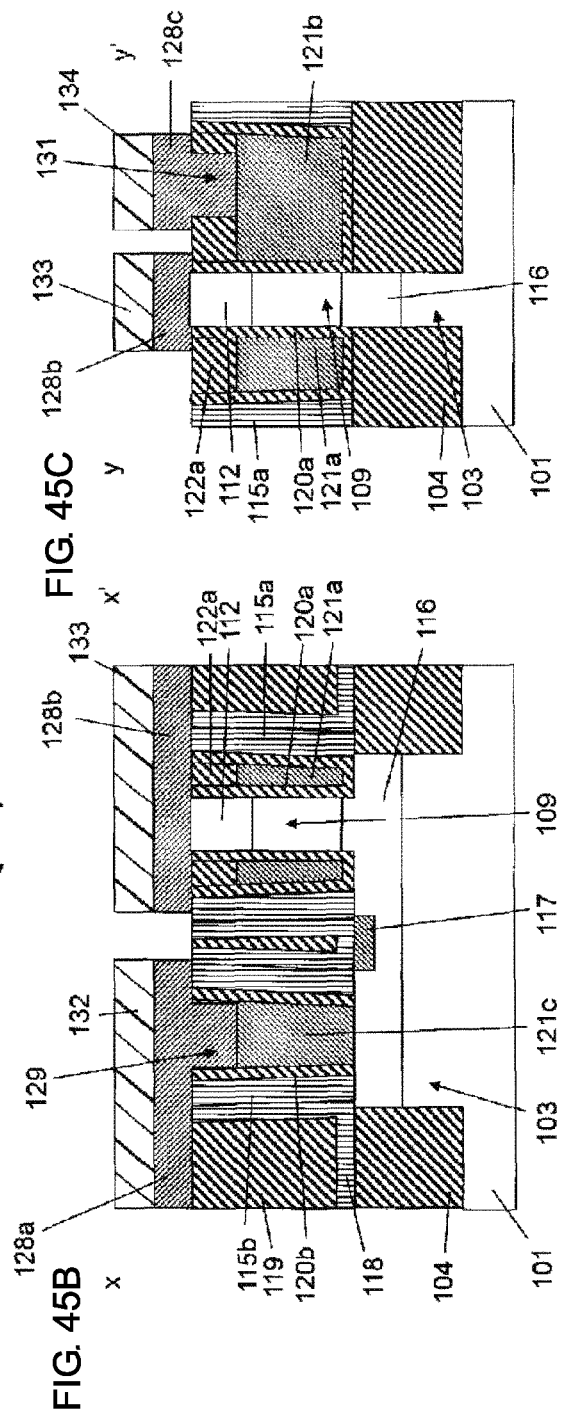
FIG. 45A
FIG. 45B
FIG. 45C

METHOD FOR PRODUCING SEMICONDUCTOR DEVICE AND SEMICONDUCTOR DEVICE

CROSS REFERENCE TO RELATED APPLICATIONS

The present application is a continuation of copending international patent application PCT/JP2014/055667, filed Mar. 5, 2014, the entire contents of which are incorporated herein by reference.

BACKGROUND OF THE INVENTION

Field of the Invention

The present invention relates to a method for producing a semiconductor device and to a semiconductor device.

Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as an "SGT") having a structure in which a source, a gate, and a drain are arranged vertically with respect to a substrate and a gate electrode surrounds a pillar-shaped semiconductor layer has been proposed (e.g., refer to Japanese Unexamined Patent Application Publication Nos. 2-71556, 2-188966, and 3-145761).

According to a typical method for producing an SGT, a silicon pillar on which a pillar-shaped nitride film hard mask has been formed is formed by using a mask for forming the silicon pillar, a planar silicon layer is formed at the bottom portion of the silicon pillar by using a mask for forming the planar silicon layer, and a gate line is formed by using a mask for forming the gate line (e.g., refer to Japanese Unexamined Patent Application Publication No. 2009-182317). In other words, three masks are used to form a silicon pillar, a planar silicon layer, and a gate line.

In a typical method for producing an SGT, a deep contact hole is formed in order to connect an upper portion of a planar silicon layer and a metal wire (e.g., refer to Japanese Unexamined Patent Application Publication No. 2009-182317). With reduction in the size of devices, the aspect ratio (depth/diameter) of contact holes increases. The increase in the aspect ratio causes a decrease in the etching rate. Furthermore, with reduction in the size of a pattern, the thickness of a resist decreases. If the thickness of the resist decreases, the resist is also etched during etching, which makes it difficult to form a deep contact hole.

A metal gate-last process in which a metal gate is formed after a high-temperature process has been employed in actual production of typical MOS transistors in order to achieve both a metal gate process and a high-temperature process (refer to IEDM 2007, K. Mistry et. al, pp. 247-250). A gate is formed using polysilicon, an interlayer insulating film is deposited, the polysilicon gate is exposed by chemical mechanical polishing and etched, and then a metal is deposited. Thus, a metal gate-last process in which a metal gate is formed after a high-temperature process needs to be also employed in making SGTs in order to achieve both a metal gate process and a high-temperature process.

If an upper portion of a hole is narrower than a lower portion of the hole during filling with a metal, the upper portion of the hole is filled with the metal first, resulting in formation of holes.

In typical MOS transistors, a first insulating film is used to decrease parasitic capacitance between the gate line and the substrate. For example, in a FINFET (refer to IEDM 2010 CC. Wu, et. al, 27.1.1-27.1.4), a first insulating film is formed around one fin-shaped semiconductor layer and etched back to expose the fin-shaped semiconductor layer in order to decrease parasitic capacitance between the gate line and the substrate. Accordingly, the first insulating film needs to be also used in an SGT in order to decrease parasitic capacitance between the gate line and the substrate. Since such an SGT includes a pillar-shaped semiconductor layer in addition to a fin-shaped semiconductor layer, special consideration is required to form the pillar-shaped semiconductor layer.

SUMMARY OF THE INVENTION

Accordingly, it is an object to provide a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed, and an SGT structure obtained by the method.

The method for producing a semiconductor device according to an aspect of the present invention includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; and a third step of, after the second step, forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

An upper surface of the second dummy gate may have a larger area than a lower surface of the second dummy gate.

The method may further include, after the fourth insulating film is formed around the pillar-shaped semiconductor layer and the first dummy gate, forming a third resist, etching back the third resist to expose an upper portion of the pillar-shaped semiconductor layer, and forming a first diffusion layer in an upper portion of the pillar-shaped semiconductor layer.

The method may further include a fourth step of forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

The method may further include a fifth step of, after the fourth step, depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal to form a gate electrode, a gate line, and a first contact.

A semiconductor device according to another aspect of the present invention includes a fin-shaped semiconductor layer formed on a semiconductor substrate, a first insulating film formed around the fin-shaped semiconductor layer, a first contact formed on the fin-shaped semiconductor layer, and a gate insulating film formed around the first contact.

An upper surface of the first contact may have a larger area than a lower surface of the first contact.

The semiconductor device may also include a pillar-shaped semiconductor layer formed on the fin-shaped semiconductor layer, a gate insulating film formed around the pillar-shaped semiconductor layer, a gate electrode formed around the gate insulating film and made of a metal, a gate line connected to the gate electrode, extending in a direction perpendicular to a direction in which the fin-shaped semiconductor layer extends, and made of the metal, a first diffusion layer formed in an upper portion of the pillar-shaped semiconductor layer, and a second diffusion layer formed in an upper portion of the fin-shaped semiconductor layer and a lower portion of the pillar-shaped semiconductor layer, wherein an upper surface of the gate electrode and the gate line has a larger area than a lower surface of the gate electrode and the gate line.

The gate insulating film may also be formed around and at bottom portions of the gate electrode and the gate line.

According to the present invention, there can be provided a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed, and an SGT structure obtained by the method.

The method for producing a semiconductor device includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; and a third step of, after the second step, forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer. Thus, a fin-shaped semiconductor layer, a pillar-shaped semiconductor layer, a gate electrode, and a gate line can be formed by self-alignment, which decreases the number of steps.

A gate electrode, a gate line, and a first contact can be formed by simultaneously forming the second dummy gate and the first dummy contact, then depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal. Therefore, etching may be performed by the thickness of the gate insulating film, and thus a step of forming a deep contact hole is not required.

Since the gate insulating film at the bottom portion of the region where the first dummy contact has been present has been removed, the gate insulating film remains on an inner surface of the fifth insulating film in the region where the first dummy contact has been present. The gate insulating film is a highly insulating film formed by atomic layer deposition, and thus can insulate the first contact from the surrounding structure.

The first and second hard masks prevent the formation of a metal-semiconductor compound on the first and second dummy gates. Thus, a metal-semiconductor compound can be formed only on the fin-shaped semiconductor layer.

When the second polysilicon is etched, by employing reverse-taper etching, the area of an upper surface of the second dummy gate can be made larger than that of a lower surface of the second dummy gate. Thus, in filling with a metal for forming a gate, the formation of holes can be prevented. At the same time, the area of an upper surface of the first dummy contact can be made larger than that of a lower surface of the first dummy contact. Thus, in filling with a metal for a first contact, the formation of holes can be prevented.

A typical metal gate-last production process can be employed which includes forming a first dummy gate and a second dummy gate using a polysilicon, depositing an interlayer insulating film, performing chemical mechanical polishing to expose the first dummy gate and the second dummy gate, etching the polysilicon gate, and then depositing a metal. Therefore, a metal gate SGT can be easily produced.

The gate insulating film formed around and at bottom portions of the gate electrode and the gate line can insulate the gate electrode and the gate line from the pillar-shaped semiconductor layer and the fin-shaped semiconductor layer.

Other features which are considered as characteristic for the invention are set forth in the appended claims.

Although the invention is illustrated and described herein as embodied in a method of producing a semiconductor device and in a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 2A is a plan view illustrating a method for producing a semiconductor device according to an embodiment of the present invention, FIG. 2B is a sectional view taken along line X-X' in FIG. 2A, and FIG. 2C is a sectional view taken along line Y-Y' in FIG. 2A.

FIG. 3A is a plan view illustrating a method for producing a semiconductor device according to an embodiment of the present invention, FIG. 3B is a sectional view taken along line X-X' in FIG. 3A, and FIG. 3C is a sectional view taken along line Y-Y' in FIG. 3A.

FIG. 4A is a plan view illustrating a method for producing a semiconductor device according to an embodiment of the present invention, FIG. 4B is a sectional view taken along line X-X' in FIG. 4A, and FIG. 4C is a sectional view taken along line Y-Y' in FIG. 4A.

FIG. 5A is a plan view illustrating a method for producing a semiconductor device according to an embodiment of the present invention, FIG. 5B is a sectional view taken along line X-X' in FIG. 5A, and FIG. 5C is a sectional view taken along line Y-Y' in FIG. 5A.

FIG. 9A is a plan view illustrating a method for producing a semiconductor device according to an embodiment of the present invention, FIG. 9B is a sectional view taken along line X-X' in FIG. 9A, and FIG. 9C is a sectional view taken along line Y-Y' in FIG. 9A.

FIG. 10A is a plan view illustrating a method for producing a semiconductor device according to an embodiment of the present invention, FIG. 10B is a sectional view taken along line X-X' in FIG. 10A, and FIG. 10C is a sectional view taken along line Y-Y' in FIG. 10A.

FIG. 11A is a plan view illustrating a method for producing a semiconductor device according to an embodiment of the present invention, FIG. 11B is a sectional view taken along line X-X' in FIG. 11A, and FIG. 11C is a sectional view taken along line Y-Y' in FIG. 11A.

FIG. 12A is a plan view illustrating a method for producing a semiconductor device according to an embodiment of the present invention, FIG. 12B is a sectional view taken along line X-X' in FIG. 12A, and FIG. 12C is a sectional view taken along line Y-Y' in FIG. 12A.

FIG. 13A is a plan view illustrating a method for producing a semiconductor device according to an embodiment of the present invention, FIG. 13B is a sectional view taken along line X-X' in FIG. 13A, and FIG. 13C is a sectional view taken along line Y-Y' in FIG. 13A.

FIG. 16A is a plan view illustrating a method for producing a semiconductor device according to an embodiment of the present invention, FIG. 16B is a sectional view taken along line X-X' in FIG. 16A, and FIG. 16C is a sectional view taken along line Y-Y' in FIG. 16A.

FIG. 18A is a plan view illustrating a method for producing a semiconductor device according to an embodiment of the present invention, FIG. 18B is a sectional view taken along line X-X' in FIG. 18A, and FIG. 18C is a sectional view taken along line Y-Y' in FIG. 18A.

FIG. 19A is a plan view illustrating a method for producing a semiconductor device according to an embodiment of the present invention, FIG. 19B is a sectional view taken along line X-X' in FIG. 19A, and FIG. 19C is a sectional view taken along line Y-Y' in FIG. 19A.

FIG. 20A is a plan view illustrating a method for producing a semiconductor device according to an embodiment of the present invention, FIG. 20B is a sectional view taken along line X-X' in FIG. 20A, and FIG. 20C is a sectional view taken along line Y-Y' in FIG. 20A.

FIG. 21A is a plan view illustrating a method for producing a semiconductor device according to an embodiment of the present invention, FIG. 21B is a sectional view taken along line X-X' in FIG. 21A, and FIG. 21C is a sectional view taken along line Y-Y' in FIG. 21A.

FIG. 23A is a plan view illustrating a method for producing a semiconductor device according to an embodiment of the present invention, FIG. 23B is a sectional view taken along line X-X' in FIG. 23A, and FIG. 23C is a sectional view taken along line Y-Y' in FIG. 23A.

FIG. 24A is a plan view illustrating a method for producing a semiconductor device according to an embodiment of the present invention, FIG. 24B is a sectional view taken along line X-X' in FIG. 24A, and FIG. 24C is a sectional view taken along line Y-Y' in FIG. 24A.

FIG. 26A is a plan view illustrating a method for producing a semiconductor device according to an embodiment of the present invention, FIG. 26B is a sectional view taken along line X-X' in FIG. 26A, and FIG. 26C is a sectional view taken along line Y-Y' in FIG. 26A.

FIG. 27A is a plan view illustrating a method for producing a semiconductor device according to an embodiment of the present invention, FIG. 27B is a sectional view taken along line X-X' in FIG. 27A, and FIG. 27C is a sectional view taken along line Y-Y' in FIG. 27A.

FIG. 30A is a plan view illustrating a method for producing a semiconductor device according to an embodiment of the present invention, FIG. 30B is a sectional view taken along line X-X' in FIG. 30A, and FIG. 30C is a sectional view taken along line Y-Y' in FIG. 30A.

FIG. 33A is a plan view illustrating a method for producing a semiconductor device according to an embodiment of the present invention, FIG. 33B is a sectional view taken along line X-X' in FIG. 33A, and FIG. 33C is a sectional view taken along line Y-Y' in FIG. 33A.

FIG. 35A is a plan view illustrating a method for producing a semiconductor device according to an embodiment of the present invention, FIG. 35B is a sectional view taken along line X-X' in FIG. 35A, and FIG. 35C is a sectional view taken along line Y-Y' in FIG. 35A.

FIG. 39A is a plan view illustrating a method for producing a semiconductor device according to an embodiment of the present invention, FIG. 39B is a sectional view taken along line X-X' in FIG. 39A, and FIG. 39C is a sectional view taken along line Y-Y' in FIG. 39A.

FIG. 40A is a plan view illustrating a method for producing a semiconductor device according to an embodiment of the present invention, FIG. 40B is a sectional view taken along line X-X' in FIG. 40A, and FIG. 40C is a sectional view taken along line Y-Y' in FIG. 40A.

FIG. 41A is a plan view illustrating a method for producing a semiconductor device according to an embodiment of the present invention, FIG. 41B is a sectional view taken along line X-X' in FIG. 41A, and FIG. 41C is a sectional view taken along line Y-Y' in FIG. 41A.

FIG. 42A is a plan view illustrating a method for producing a semiconductor device according to an embodiment of the present invention, FIG. 42B is a sectional view taken along line X-X' in FIG. 42A, and FIG. 42C is a sectional view taken along line Y-Y' in FIG. 42A.

FIG. 44A is a plan view illustrating a method for producing a semiconductor device according to an embodiment of the present invention, FIG. 44B is a sectional view taken along line X-X' in FIG. 44A, and FIG. 44C is a sectional view taken along line Y-Y' in FIG. 44A.

FIG. 45A is a plan view illustrating a method for producing a semiconductor device according to an embodiment of the present invention, FIG. 45B is a sectional view taken along line X-X' in FIG. 45A, and FIG. 45C is a sectional view taken along line Y-Y' in FIG. 45A.

DETAILED DESCRIPTION OF THE INVENTION

Figures 1A, 1B, 1C:
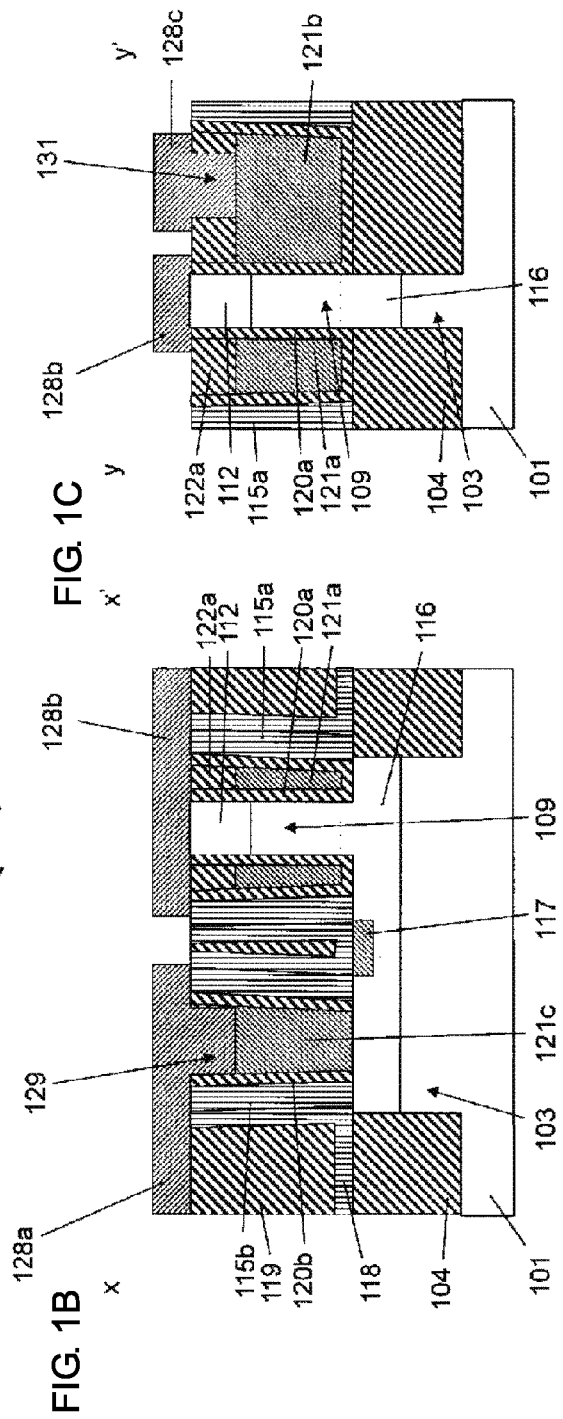
FIG. 1A is a plan view illustrating a semiconductor device according to an embodiment of the present invention.
FIG. 1B is a sectional view taken along line X-X' in FIG. 1A.
FIG. 1C is a sectional view taken along line Y-Y' in FIG. 1A.

Referring now to the figures of the drawing in detail, a production process for forming an SGT structure according to an embodiment of the present invention will be described with reference to FIG. 2A to FIG. 46C.

Described first is a first step that includes forming a fin-shaped semiconductor layer on a semiconductor substrate and forming a first insulating film around the fin-shaped semiconductor layer. In this embodiment, a silicon substrate is used, but any semiconductor substrate other than the silicon substrate may be used.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. Herein, the fin-shaped silicon layer has been formed using a resist as a mask, but a hard mask such as an oxide film or a nitride film may be used.

As illustrated in FIGS. 4A to 4C, the first resist 102 is removed.

As illustrated in FIGS. 5A to 5C, a first insulating film 104 is deposited around the fin-shaped silicon layer 103. An oxide film formed by high-density plasma or an oxide film formed by low-pressure chemical vapor deposition (CVD) may be used as the first insulating film.

Figure 6A:
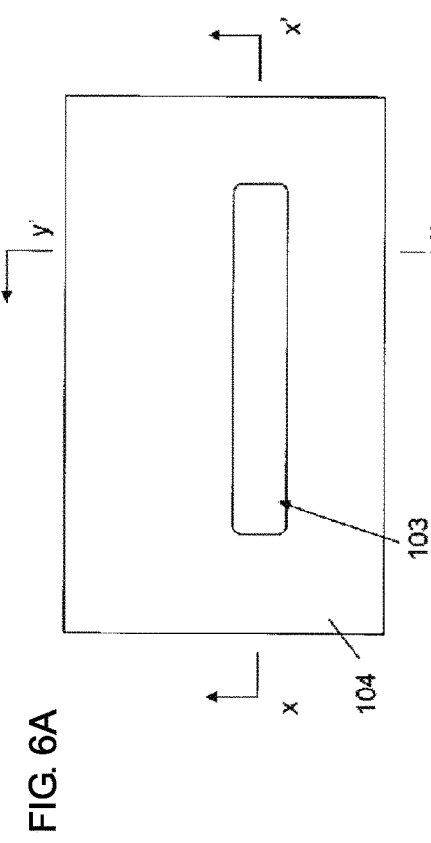
FIG. 6A is a plan view illustrating a method for producing a semiconductor device according to an embodiment of the present invention.
Figure 6C:
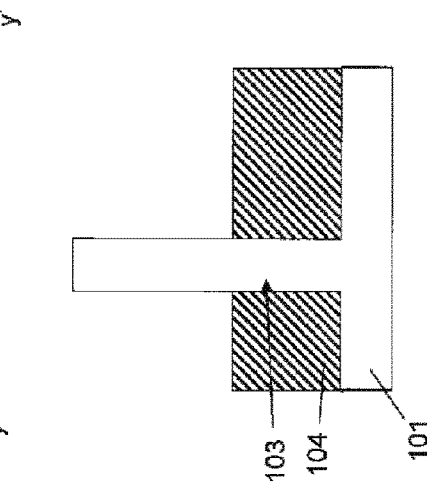
FIG. 6C is a sectional view taken along line Y-Y' in FIG. 6A.
Figure 6B:
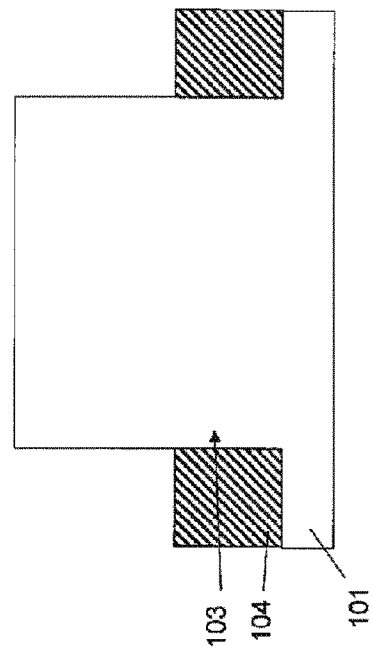
FIG. 6B is a sectional view taken along line X-X' in FIG. 6A.

As illustrated in FIGS. 6A to 6C, the first insulating film 104 is etched back to expose an upper portion of the fin-shaped silicon layer 103. The process so far is the same as that of a method for making a fin-shaped silicon layer in IEDM 2010 CC. Wu, et. al, 27.1.1-27.1.4.

The description so far has shown a first step that includes forming a fin-shaped silicon layer 103 on a silicon substrate 101 and forming a first insulating film 104 around the fin-shaped silicon layer 103.

Described next is a second step that includes forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film.

Figure 7C:
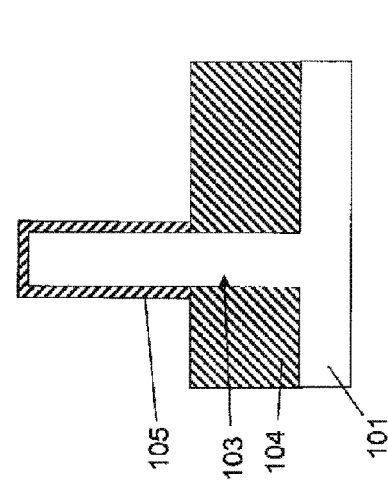
FIG. 7C is a sectional view taken along line Y-Y' in FIG. 7A.
Figure 7A:
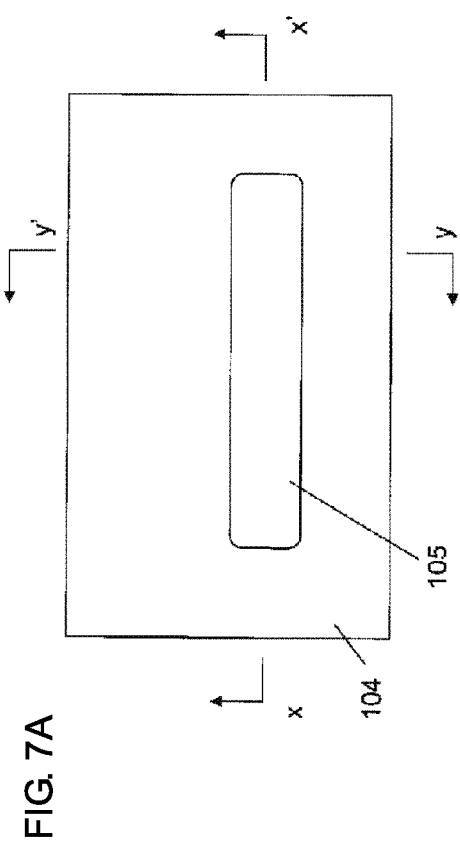
FIG. 7A is a plan view illustrating a method for producing a semiconductor device according to an embodiment of the present invention.
Figure 7B:
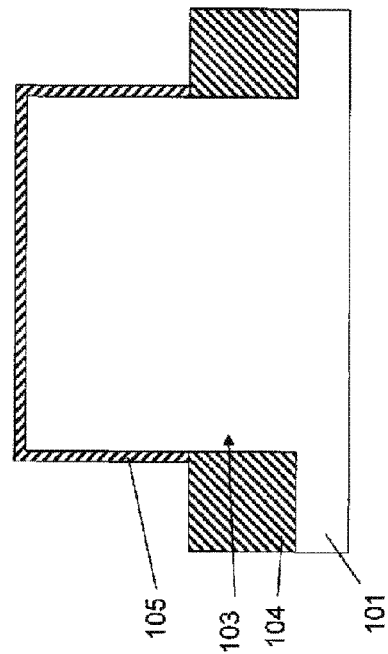
FIG. 7B is a sectional view taken along line X-X' in FIG. 7A.

As illustrated in FIGS. 7A to 7C, a second insulating film 105 is formed around the fin-shaped silicon layer 103. The second insulating film 105 is preferably an oxide film.

Figure 8A:
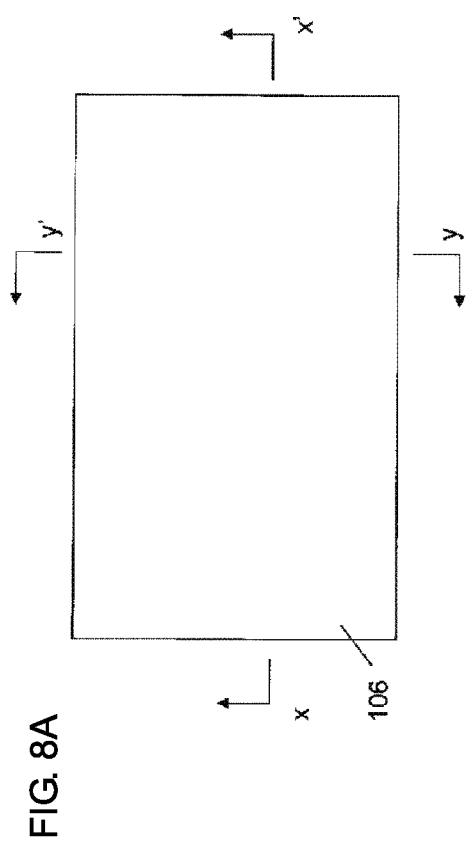
FIG. 8A is a plan view illustrating a method for producing a semiconductor device according to an embodiment of the present invention.
Figure 8C:
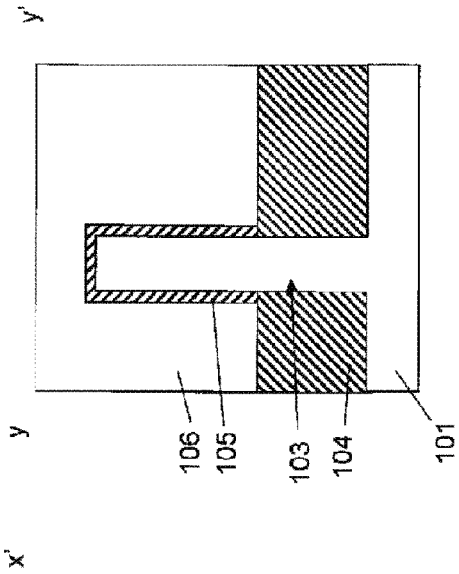
FIG. 8C is a sectional view taken along line Y-Y' in FIG. 8A.
Figure 8B:
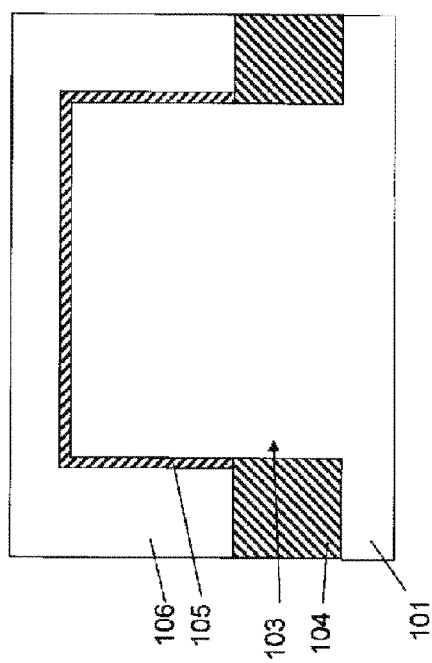
FIG. 8B is a sectional view taken along line X-X' in FIG. 8A.

As illustrated in FIGS. 8A to 8C, a first polysilicon 106 is deposited on the second insulating film 105 and planarized.

As illustrated in FIGS. 9A to 9C, a third insulating film 107 is formed on the first polysilicon 106. The third insulating film 107 is preferably a nitride film.

As illustrated in FIGS. 10A to 10C, a second resist 108 for forming a gate line and a pillar-shaped silicon layer is formed in a direction perpendicular to a direction in which the fin-shaped silicon layer 103 extends.

As illustrated in FIGS. 11A to 11C, the third insulating film 107, the first polysilicon 106, the second insulating film 105, and the fin-shaped silicon layer 103 are etched to form a pillar-shaped silicon layer 109, a first dummy gate 106a formed of the first polysilicon, and a first hard mask 107a formed of the third insulating film.

As illustrated in FIGS. 12A to 12C, the second resist 108 is removed.

The description so far has shown a second step that includes forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film.

Described next is a third step that follows the second step and includes forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

As illustrated in FIGS. 13A to 13C, a fourth insulating film 110 is formed around the pillar-shaped silicon layer 109 and the first dummy gate 106a. The fourth insulating film 110 is preferably an oxide film.

Figure 14C:
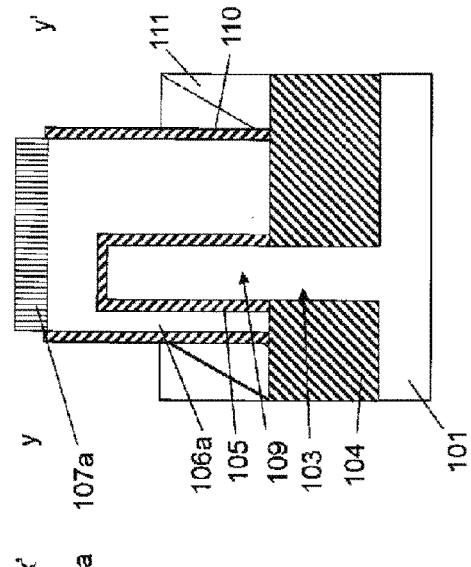
FIG. 14C is a sectional view taken along line Y-Y' in FIG. 14A.
Figure 14A:
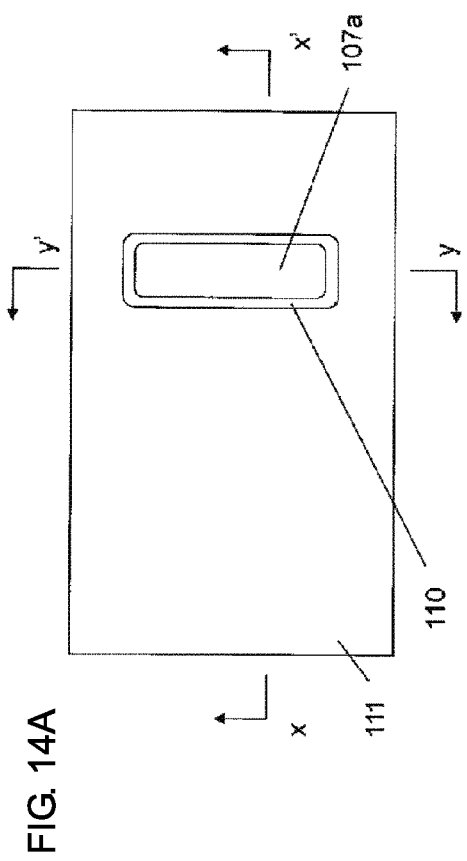
FIG. 14A is a plan view illustrating a method for producing a semiconductor device according to an embodiment of the present invention.
Figure 14B:
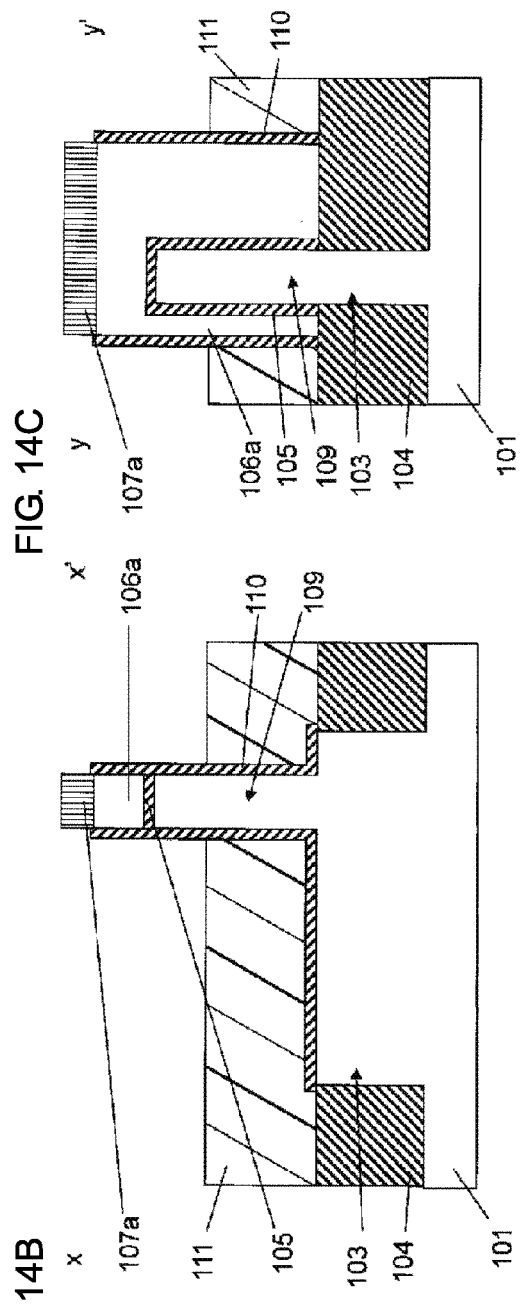
FIG. 14B is a sectional view taken along line X-X' in FIG. 14A.
Figure 15C:
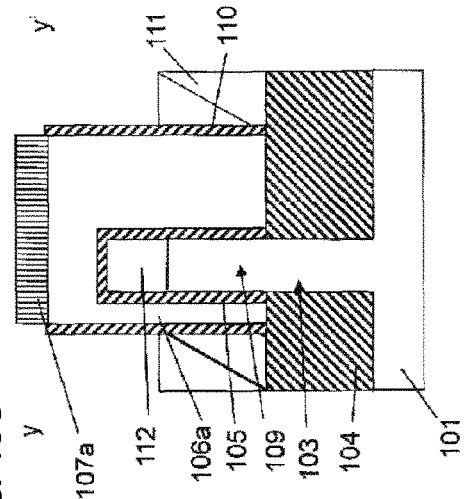
FIG. 15C is a sectional view taken along line Y-Y' in FIG. 15A.
Figure 15A:
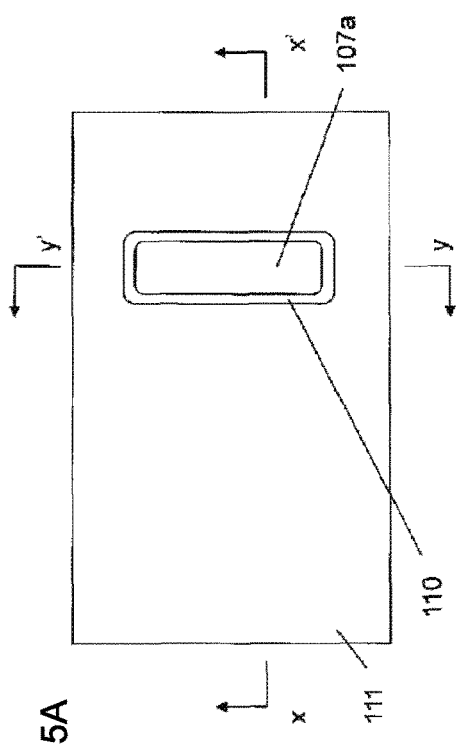
FIG. 15A is a plan view illustrating a method for producing a semiconductor device according to an embodiment of the present invention.
Figure 15B:
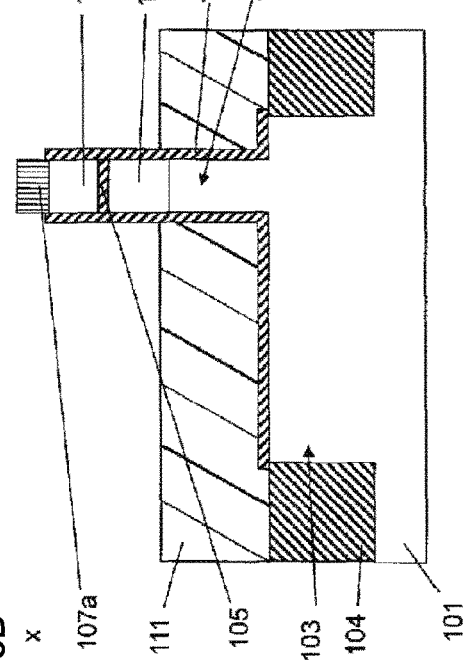
FIG. 15B is a sectional view taken along line X-X' in FIG. 15A.

As illustrated in FIGS. 14A to 14C, a third resist 111 is formed and etched back to expose an upper portion of the pillar-shaped silicon layer 109. As illustrated in FIGS. 15A to 15C, an impurity is introduced to form a first diffusion layer 112 in an upper portion of the pillar-shaped silicon layer 109. When an n-type diffusion layer is formed, arsenic or phosphorus is preferably introduced. When a p-type diffusion layer is formed, boron is preferably introduced.

Figure 17A:
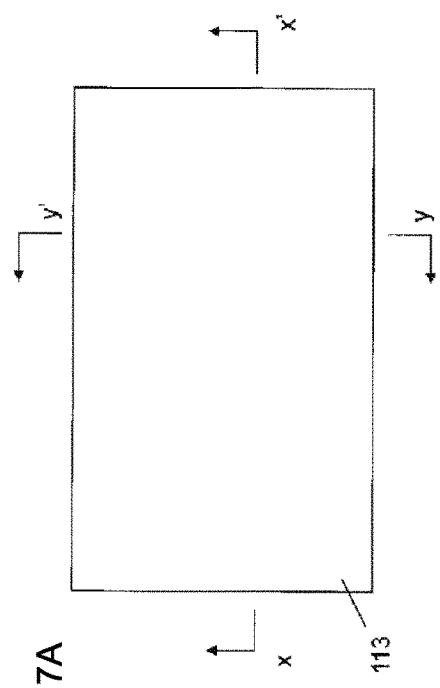
FIG. 17A is a plan view illustrating a method for producing a semiconductor device according to an embodiment of the present invention.
Figure 17C:
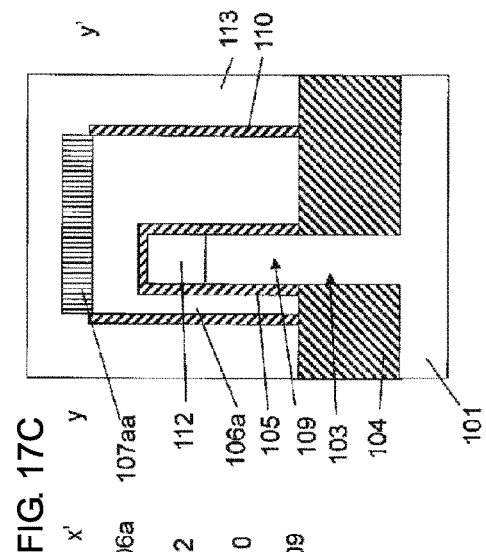
FIG. 17C is a sectional view taken along line Y-Y' in FIG. 17A.
Figure 17B:
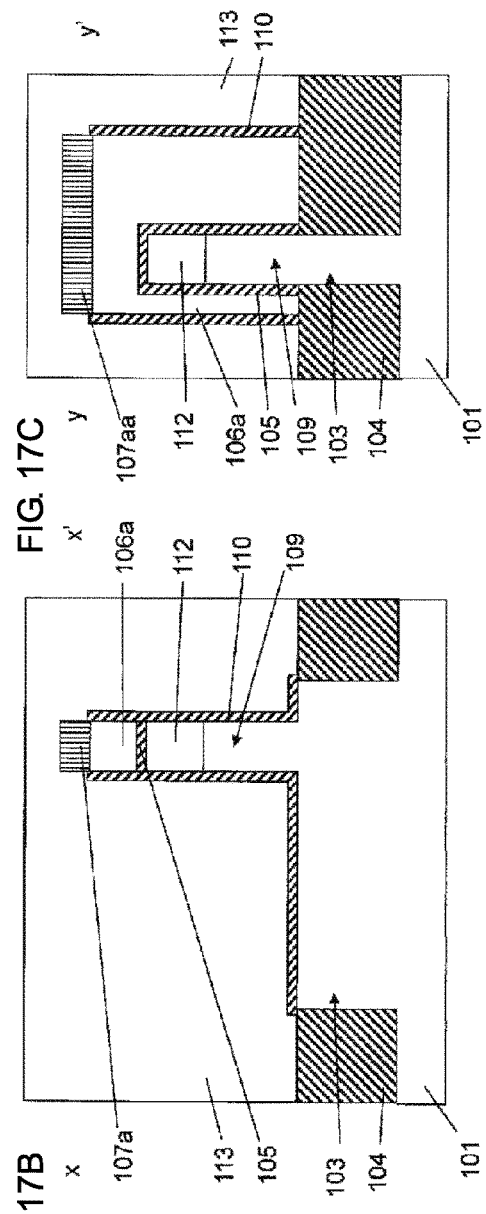
FIG. 17B is a sectional view taken along line X-X' in FIG. 17A.

As illustrated in FIGS. 16A to 16C, the third resist 111 is removed. As illustrated in FIGS. 17A to 17C, a second polysilicon 113 is deposited around the fourth insulating film 110 and planarized.

As illustrated in FIGS. 18A to 18C, the second polysilicon 113 is etched back to expose the first hard mask 107a.

As illustrated in FIGS. 19A to 19C, a sixth insulating film 114 is deposited. The sixth insulating film 114 is preferably a nitride film.

As illustrated in FIGS. 20A to 20C, a fourth resist 201 for forming a first dummy contact is formed.

As illustrated in FIGS. 21A to 21C, the sixth insulating film 114 is etched. As a result, a second hard mask 114a is formed on a sidewall of the first hard mask 107a, and a third hard mask 114b for forming the first dummy contact on the fin-shaped silicon layer is formed.

Figure 22A:
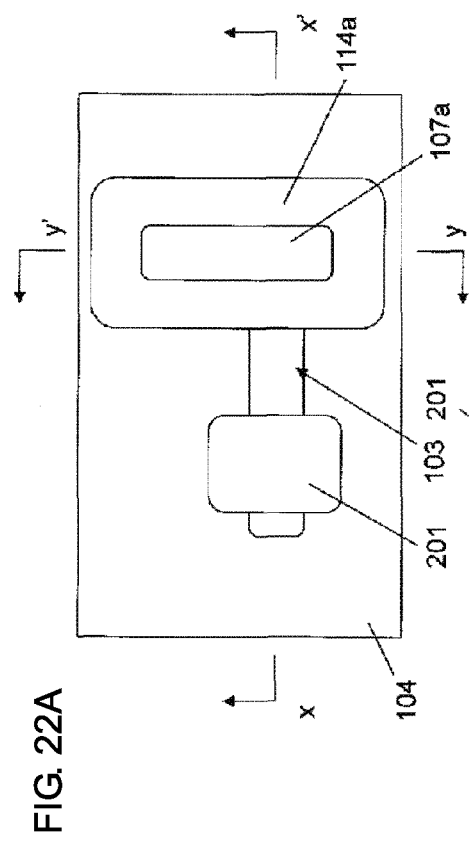
FIG. 22A is a plan view illustrating a method for producing a semiconductor device according to an embodiment of the present invention.
Figure 22C:
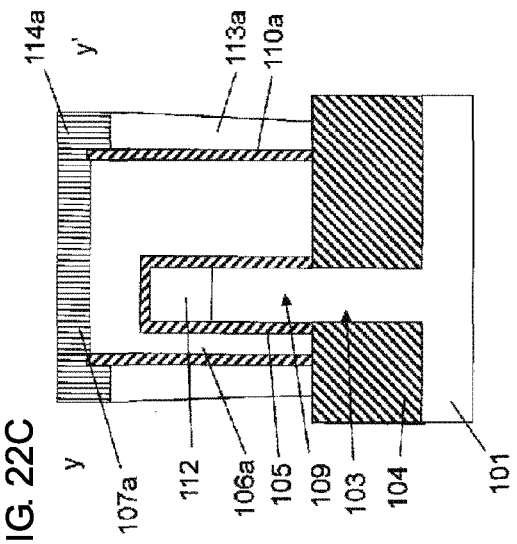
FIG. 22C is a sectional view taken along line Y-Y' in FIG. 22A.
Figure 22B:
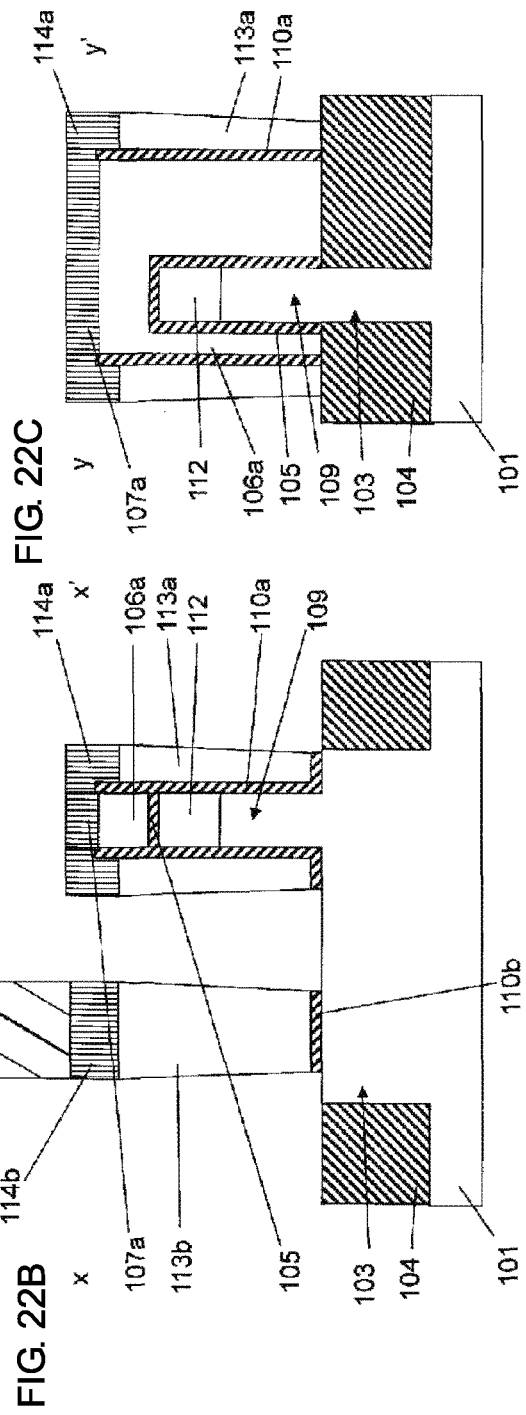
FIG. 22B is a sectional view taken along line X-X' in FIG. 22A.

As illustrated in FIGS. 22A to 22C, the second polysilicon 113 is etched so that the second polysilicon 113 is left on sidewalls of the first dummy gate 106a and the pillar-shaped semiconductor layer 109 to form a second dummy gate 113a and form a first dummy contact 113b on the fin-shaped silicon layer 103. The fourth insulating film 110 is divided into fourth insulating films 110a and 110b. When the second polysilicon 113 is etched, by employing reverse-taper etching, the area of an upper surface of the second dummy gate 113a can be made larger than that of a lower surface of the second dummy gate 113a. Thus, in filling with a metal for forming a gate, the formation of holes can be prevented. At the same time, the area of an upper surface of the first dummy contact 113b can be made larger than that of a lower surface of the first dummy contact 113b. Thus, in filling with a metal for a first contact, the formation of holes can be prevented.

As illustrated in FIGS. 23A to 23C, the fourth resist 201 is removed.

The description so far has shown a third step that follows the second step and includes forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

Described next is a fourth step that includes forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

As illustrated in FIGS. 24A to 24C, a fifth insulating film 115 is formed around the second dummy gate 113a and the first dummy contact 113b. The fifth insulating film 115 is preferably a nitride film.

Figure 25C:
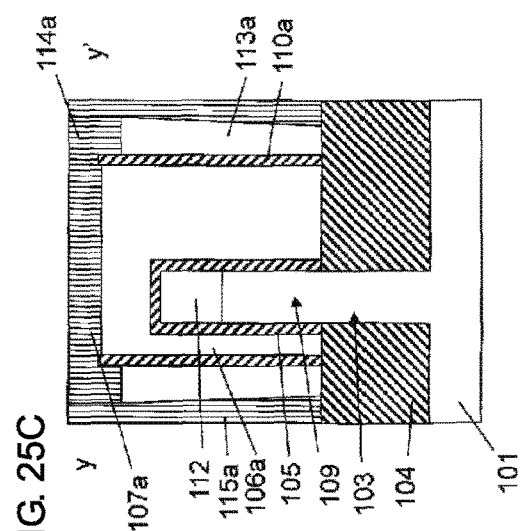
FIG. 25C is a sectional view taken along line Y-Y' in FIG. 25A.
Figure 25A:
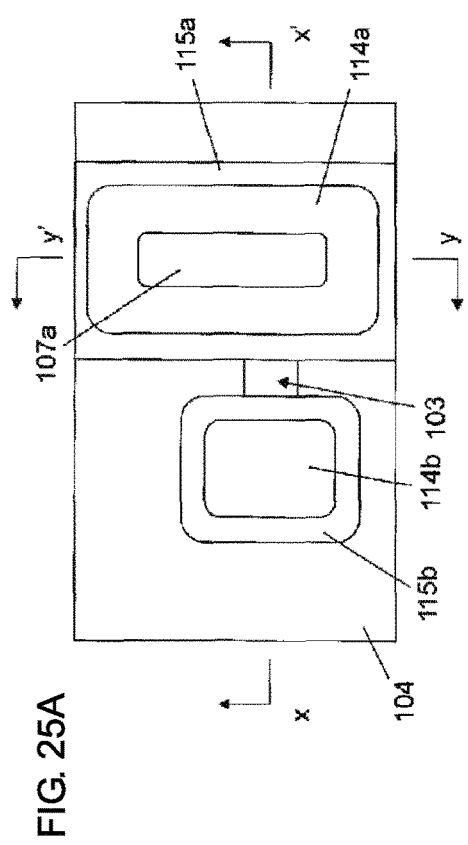
FIG. 25A is a plan view illustrating a method for producing a semiconductor device according to an embodiment of the present invention.
Figure 25B:
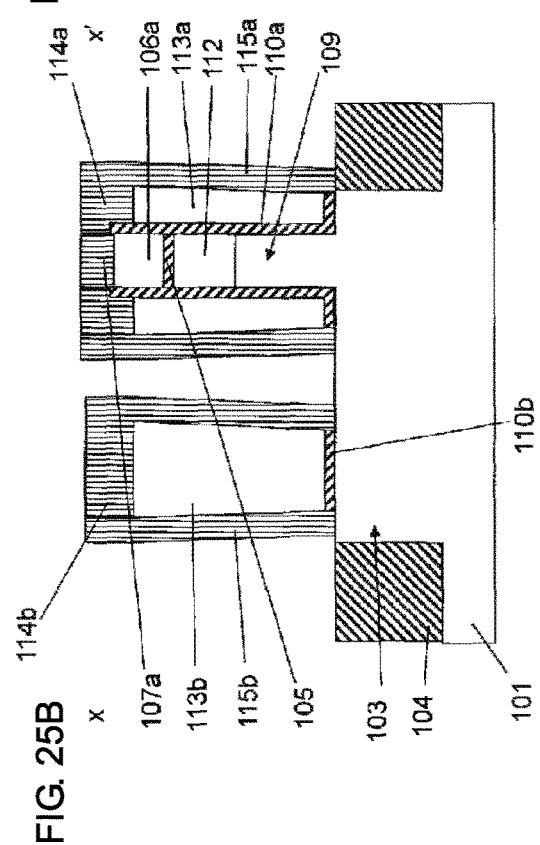
FIG. 25B is a sectional view taken along line X-X' in FIG. 25A.

As illustrated in FIGS. 25A to 25C, the fifth insulating film 115 is etched into a sidewall shape so that sidewalls 115a and 115b formed of the fifth insulating film are formed.

As illustrated in FIGS. 26A to 26C, an impurity is introduced to form a second diffusion layer 116 in an upper portion of the fin-shaped silicon layer 103 and a lower portion of the pillar-shaped silicon layer 109. When an n-type diffusion layer is formed, arsenic or phosphorus is preferably introduced. When a p-type diffusion layer is formed, boron is preferably introduced. Such an impurity may be introduced before the deposition of the fifth insulating film 115.

As illustrated in FIGS. 27A to 27C, a metal-semiconductor compound 117 is formed in an upper portion of the second diffusion layer 116. Herein, the first and second hard masks 107a and 114a prevent the formation of the metal-semiconductor compound in upper portions of the first and second dummy gates 106a and 113a. As a result, the metal-semiconductor compound can be formed only in an upper portion of the fin-shaped semiconductor layer 103.

The description so far has shown a fourth step that includes forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

Described next is a fifth step that follows the fourth step and includes depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal to form a gate electrode, a gate line, and a first contact.

Figure 28A:
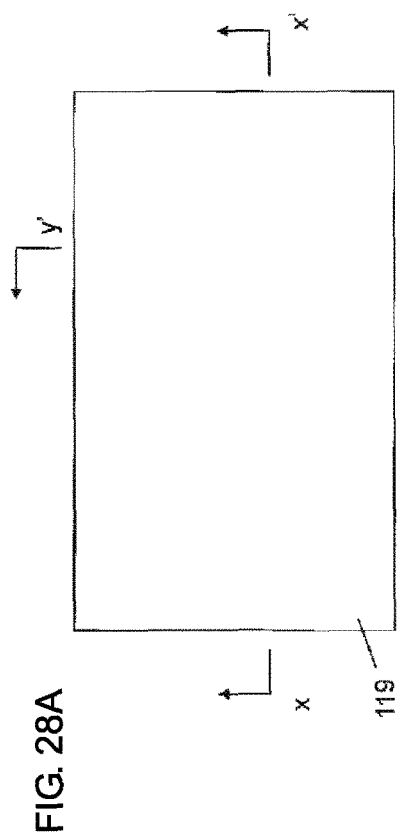
FIG. 28A is a plan view illustrating a method for producing a semiconductor device according to an embodiment of the present invention.
Figure 28C:
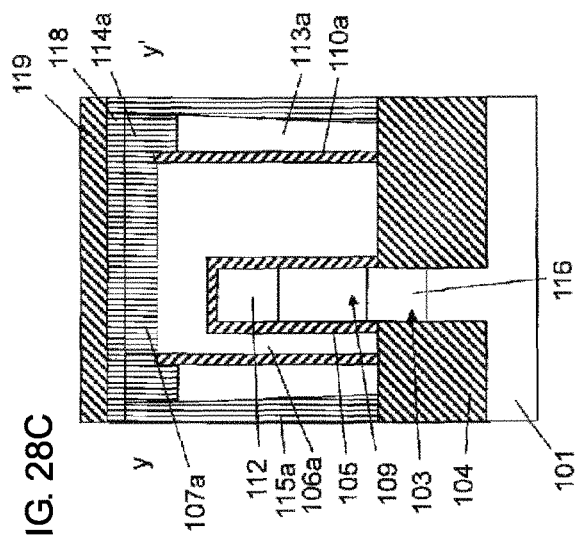
FIG. 28C is a sectional view taken along line Y-Y' in FIG. 28A.
Figure 28B:
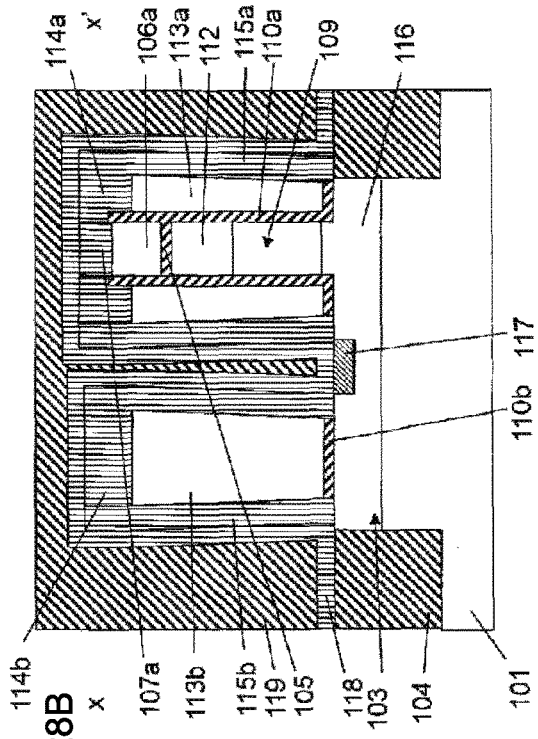
FIG. 28B is a sectional view taken along line X-X' in FIG. 28A.

As illustrated in FIGS. 28A to 28C, a contact stopper film 118 is deposited, and an interlayer insulating film 119 is deposited. The contact stopper film 118 is preferably a nitride film. The contact stopper film 118 is not necessarily deposited.

Figure 29A:
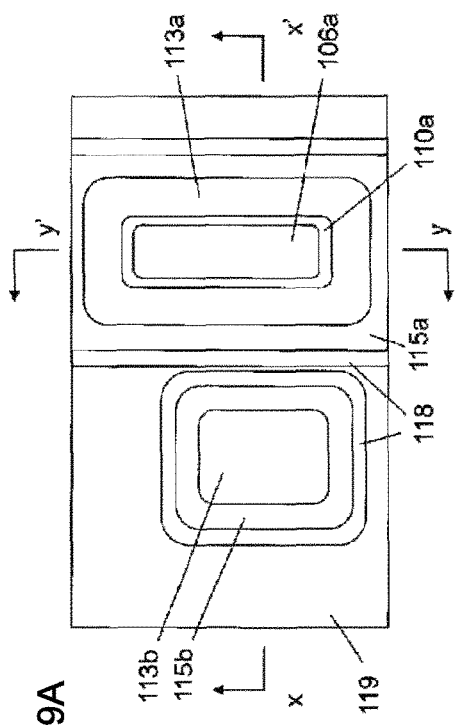
FIG. 29A is a plan view illustrating a method for producing a semiconductor device according to an embodiment of the present invention.
Figure 29C:
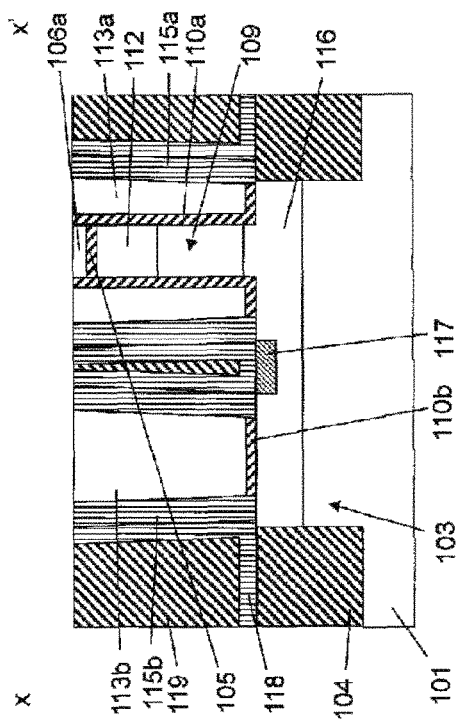
FIG. 29C is a sectional view taken along line Y-Y' in FIG. 29A.
Figure 29B:
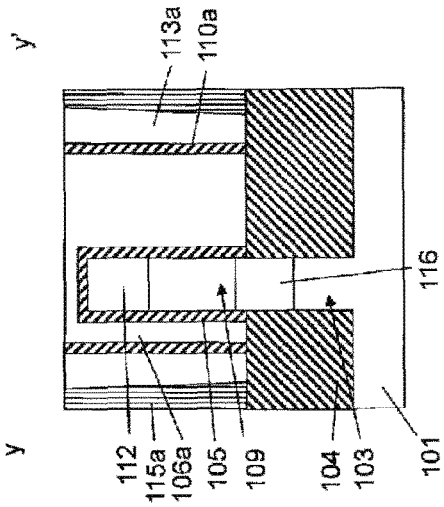
FIG. 29B is a sectional view taken along line X-X' in FIG. 29A.

As illustrated in FIGS. 29A to 29C, chemical mechanical polishing is performed to expose upper portions of the second dummy gate 113a, the first dummy gate 106a, and the first dummy contact 113b.

As illustrated in FIGS. 30A to 30C, the second dummy gate 113a, the first dummy gate 106a, and the first dummy contact 113b are removed.

Figure 31A:
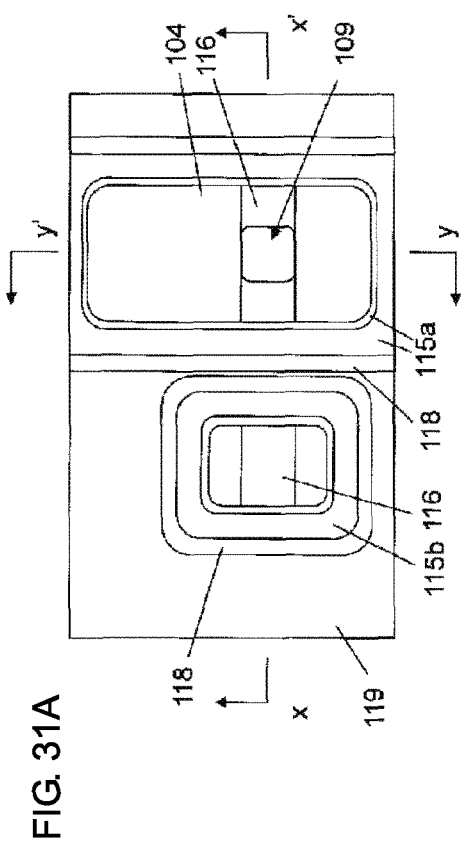
FIG. 31A is a plan view illustrating a method for producing a semiconductor device according to an embodiment of the present invention.
Figure 31C:
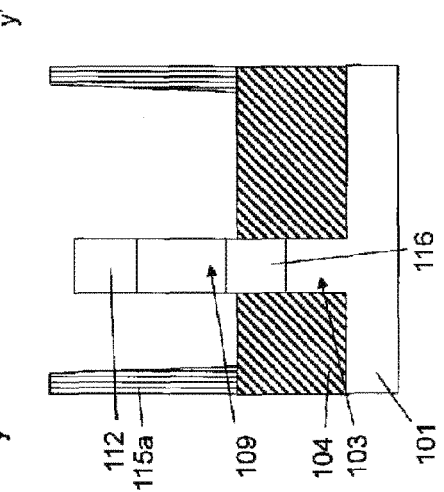
FIG. 31C is a sectional view taken along line Y-Y' in FIG. 31A.
Figure 31B:
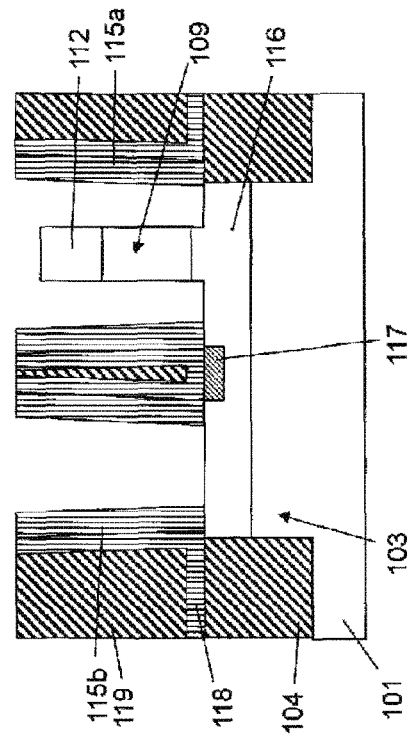
FIG. 31B is a sectional view taken along line X-X' in FIG. 31A.

As illustrated in FIGS. 31A to 31C, the second insulating film 105 and the fourth insulating films 110a and 110b are removed.

Figure 32A:
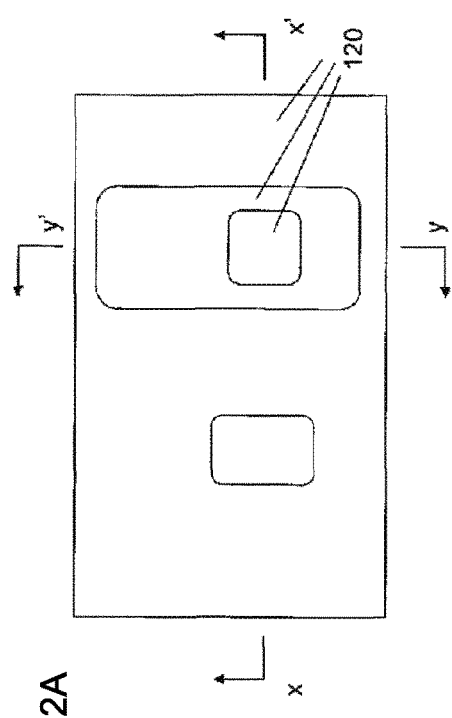
FIG. 32A is a plan view illustrating a method for producing a semiconductor device according to an embodiment of the present invention.
Figure 32C:
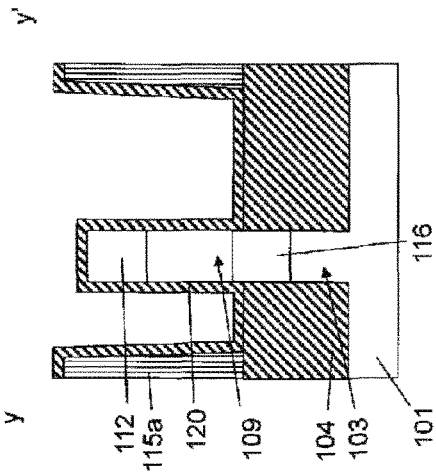
FIG. 32C is a sectional view taken along line Y-Y' in FIG. 32A.
Figure 32B:
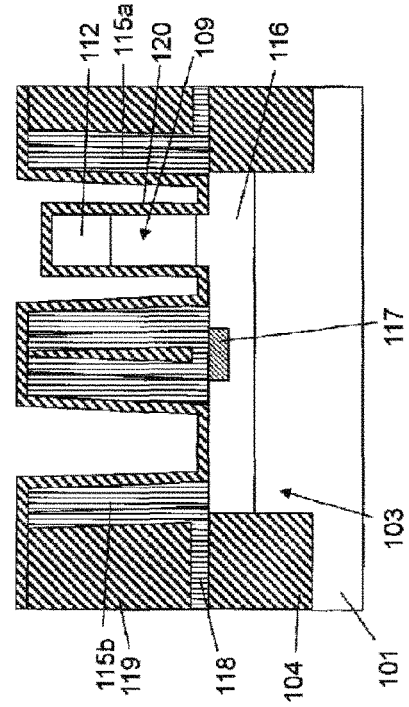
FIG. 32B is a sectional view taken along line X-X' in FIG. 32A.

As illustrated in FIGS. 32A to 32C, a gate insulating film 120 is formed around the pillar-shaped silicon layer 109 and on an inner surface of the fifth insulating film 115a in a region where the second dummy gate 113a and the first dummy gate 106a have been present and on an inner surface of the fifth insulating film 115b in a region where the first dummy contact 113b has been present. As illustrated in FIGS. 33A to 33C, a fifth resist 202 for removing the gate insulating film 120 at the bottom portion of the region where the first dummy contact 113b has been present is formed.

Figure 34A:
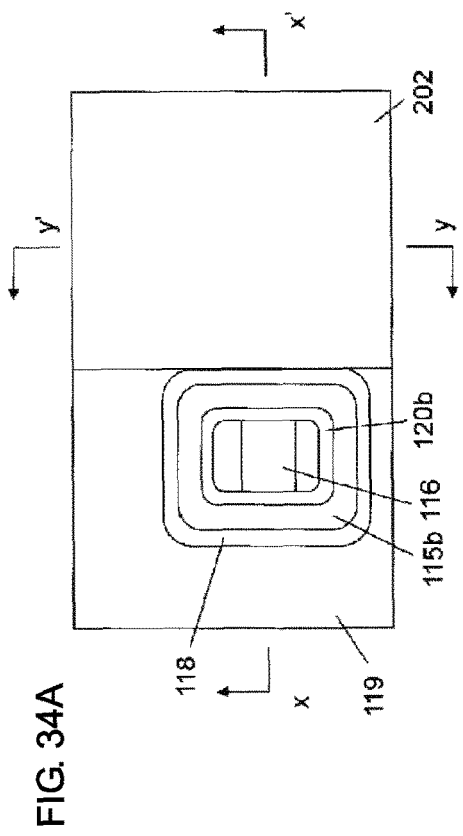
FIG. 34A is a plan view illustrating a method for producing a semiconductor device according to an embodiment of the present invention.
Figure 34C:
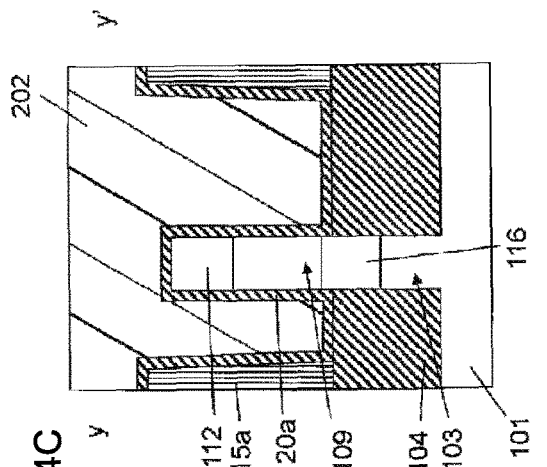
FIG. 34C is a sectional view taken along line Y-Y' in FIG. 34A.
Figure 34B:
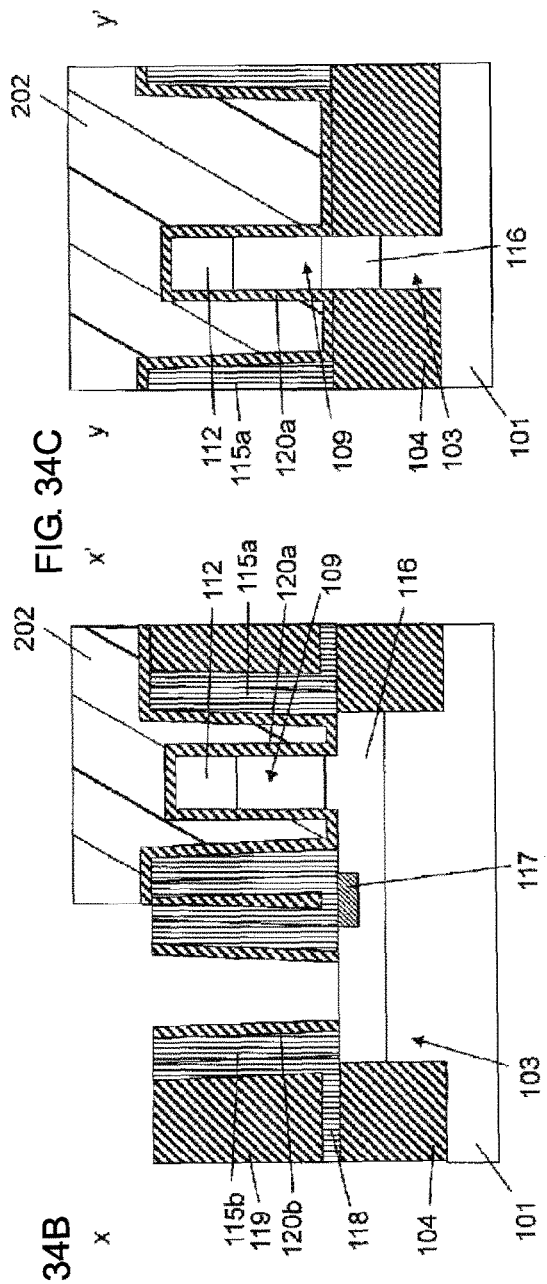
FIG. 34B is a sectional view taken along line X-X' in FIG. 34A.

As illustrated in FIGS. 34A to 34C, the gate insulating film 120 at the bottom portion of the region where the first dummy contact 113b has been present is removed. The gate insulating film 120 is divided into gate insulating films 120a and 120b. When the gate insulating film 120 is removed by performing anisotropic etching, a gate insulating film 120b is left on an inner surface of the fifth insulating film 115b in the region where the first dummy contact 113b has been present. The gate insulating film 120 may be removed by performing isotropic etching. Therefore, etching may be performed by the thickness of the gate insulating film, and thus a step of forming a deep contact hole is not required.

Figure 36A:
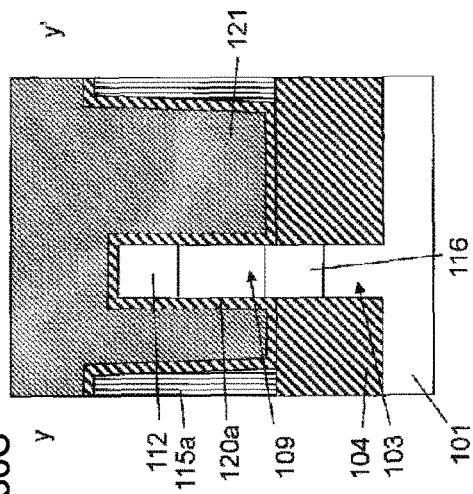
FIG. 36A is a plan view illustrating a method for producing a semiconductor device according to an embodiment of the present invention.
Figure 36B:
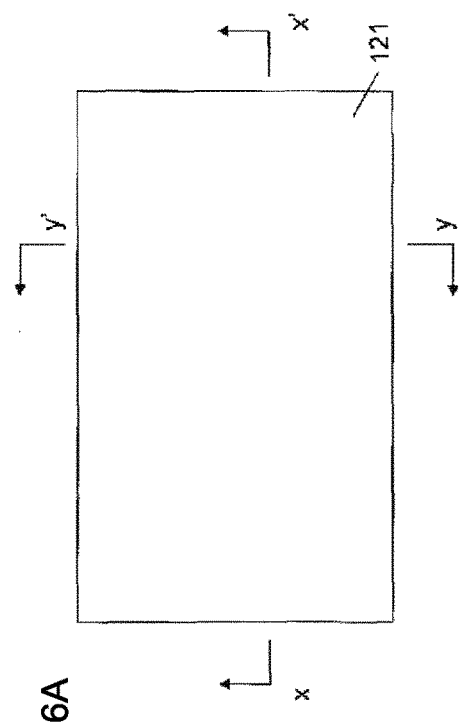
FIG. 36B is a sectional view taken along line X-X' in FIG. 36A.
Figure 36C:
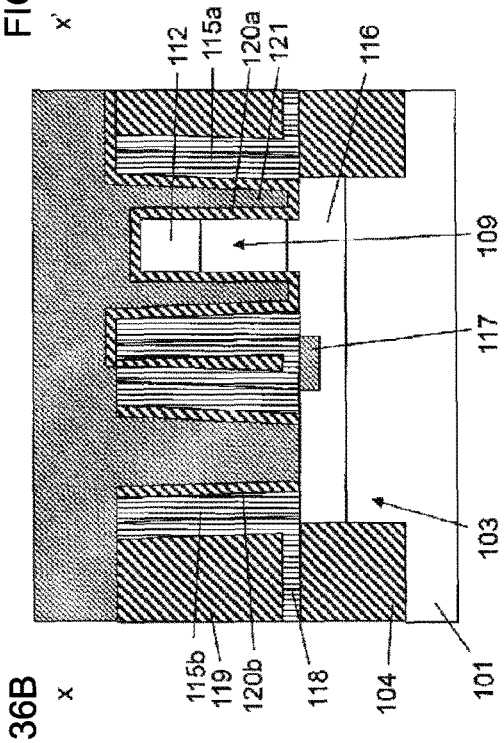
FIG. 36C is a sectional view taken along line Y-Y' in FIG. 36A.
Figure 37A:
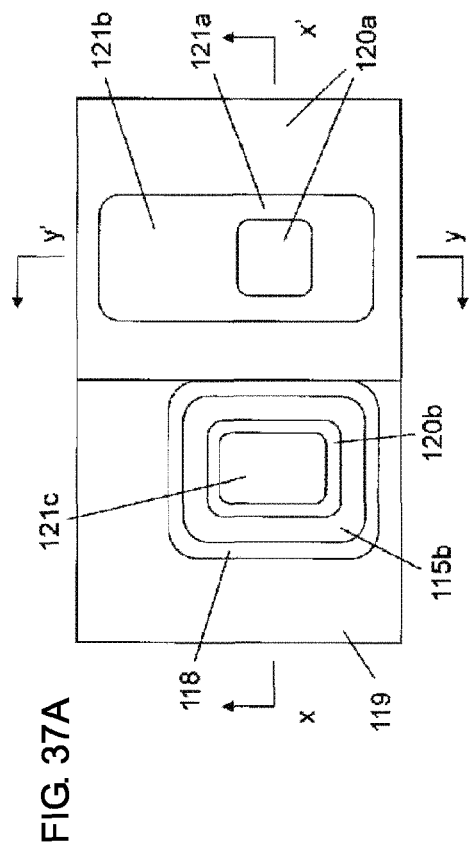
FIG. 37A is a plan view illustrating a method for producing a semiconductor device according to an embodiment of the present invention.
Figure 37B:
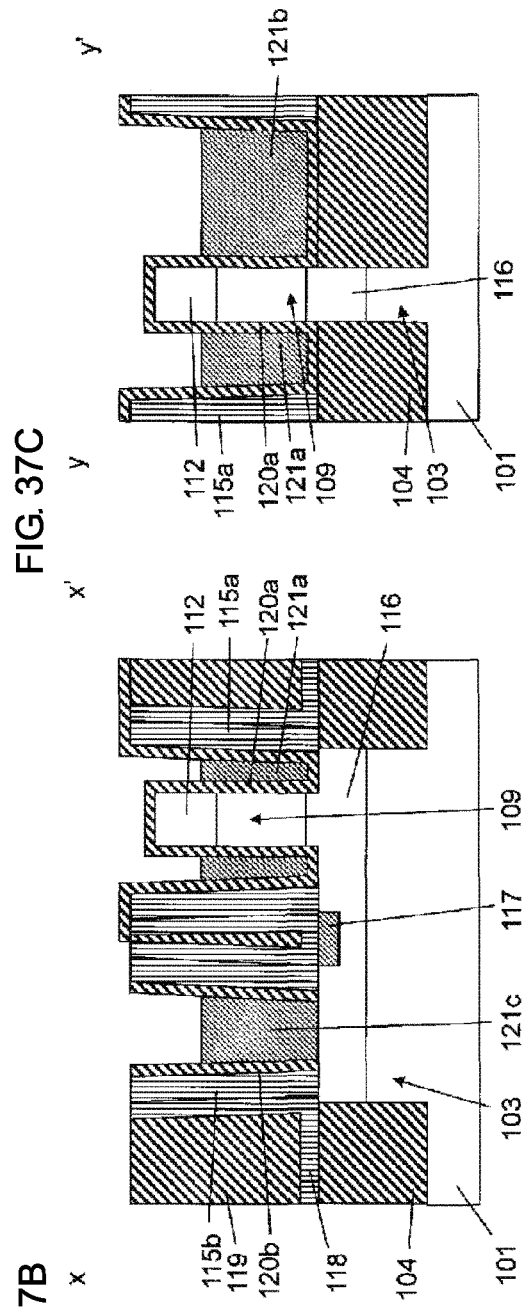
FIG. 37B is a sectional view taken along line X-X' in FIG. 37A.
Figure 37C:
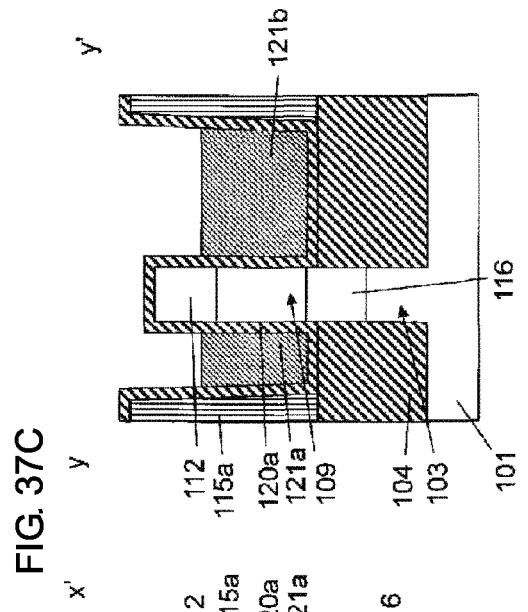
FIG. 37C is a sectional view taken along line Y-Y' in FIG. 37A.

As illustrated in FIGS. 35A to 35C, the fifth resist 202 is removed. As illustrated in FIGS. 36A to 36C, a metal 121 is deposited. As illustrated in FIGS. 37A to 37C, the metal 121 is etched back to expose an upper portion of the pillar-shaped silicon layer 109. A gate electrode 121a is formed around the pillar-shaped silicon layer 109. A gate line 121b is also formed. A first contact 121c is also formed. The gate insulating films 120a and 120b formed around and at the bottom portions of the gate electrode 121a and the gate line 121b can insulate the gate electrode 121a and the gate line 121b from the pillar-shaped silicon layer 109 and the fin-shaped silicon layer 103.

The description so far has shown a fifth step that follows the fourth step and includes depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal to form a gate electrode, a gate line, and a first contact.

Figure 38A:
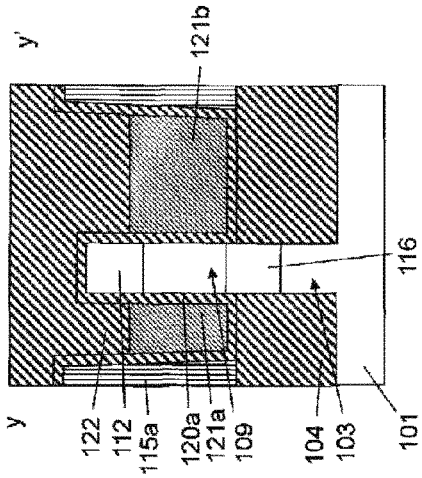
FIG. 38A is a plan view illustrating a method for producing a semiconductor device according to an embodiment of the present invention.
Figure 38B:
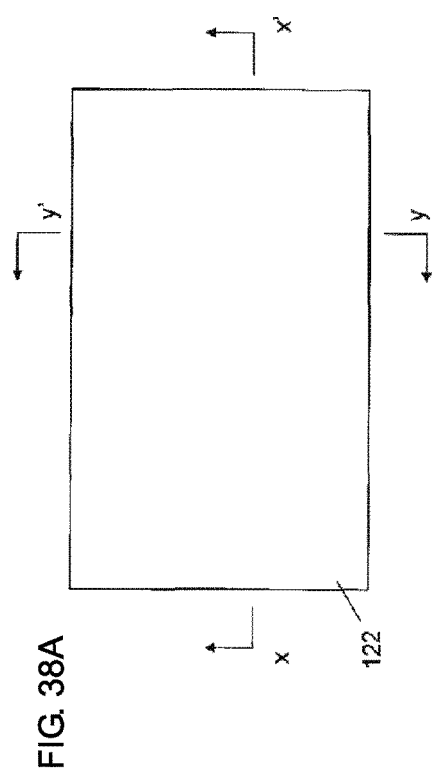
FIG. 38B is a sectional view taken along line X-X' in FIG. 38A.
Figure 38C:
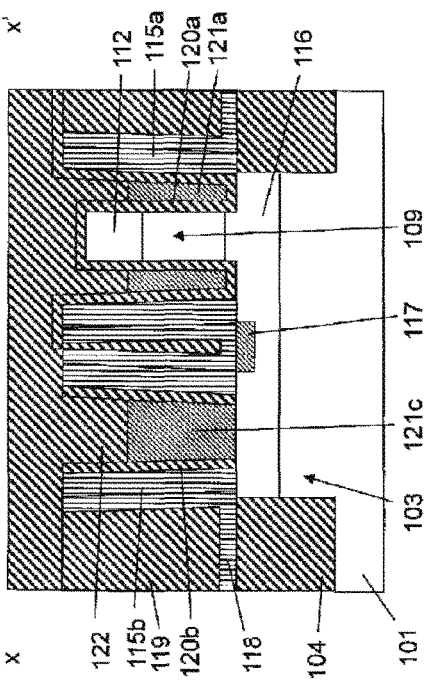
FIG. 38C is a sectional view taken along line Y-Y' in FIG. 38A.
Figure 43A:
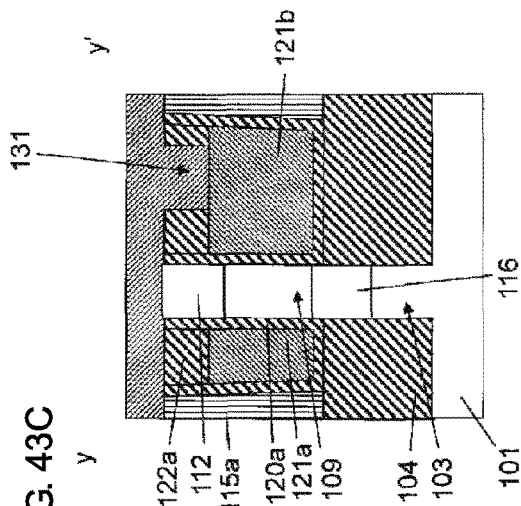
FIG. 43A is a plan view illustrating a method for producing a semiconductor device according to an embodiment of the present invention.
Figure 43B:
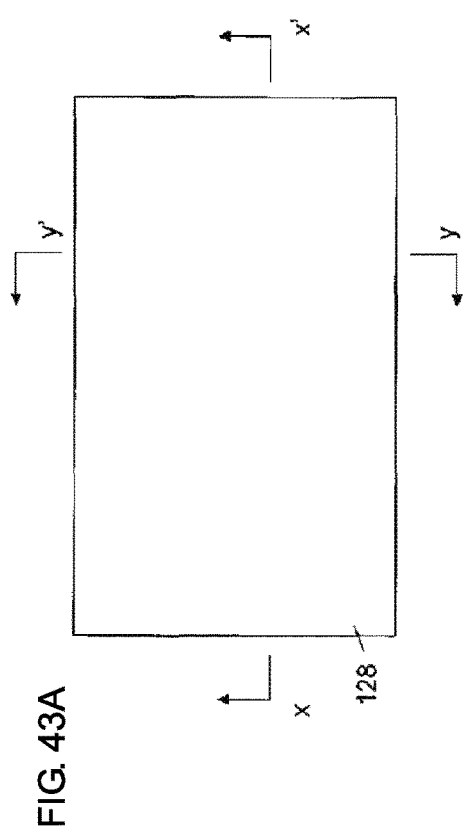
FIG. 43B is a sectional view taken along line X-X' in FIG. 43A.
Figure 43C:
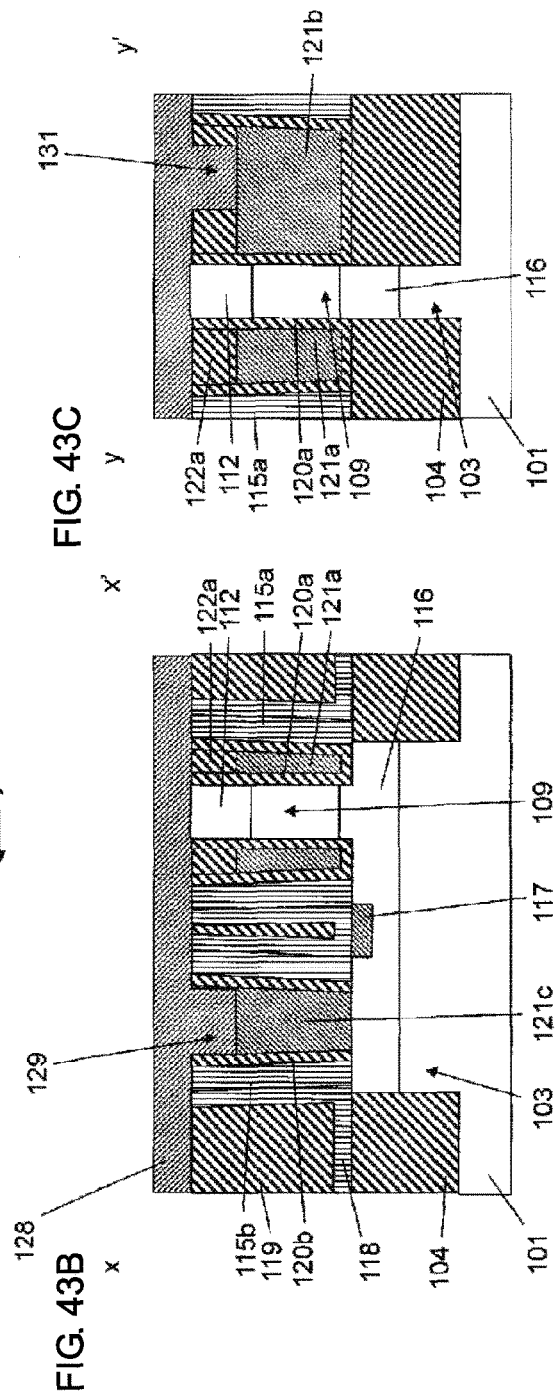
FIG. 43C is a sectional view taken along line Y-Y' in FIG. 43A.
Figure 46A:
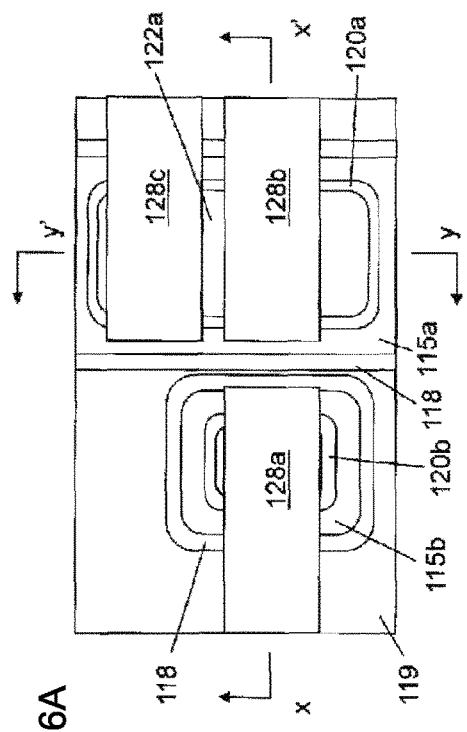
FIG. 46A is a plan view illustrating a method for producing a semiconductor device according to an embodiment of the present invention.
Figure 46C:
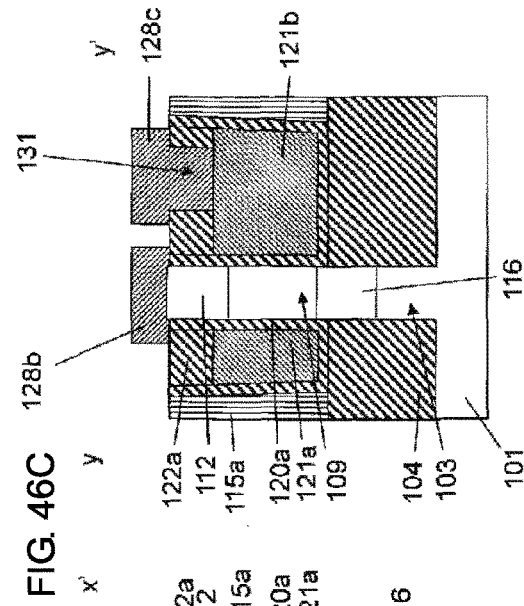
FIG. 46C is a sectional view taken along line Y-Y' in FIG. 46A.
Figure 46B:
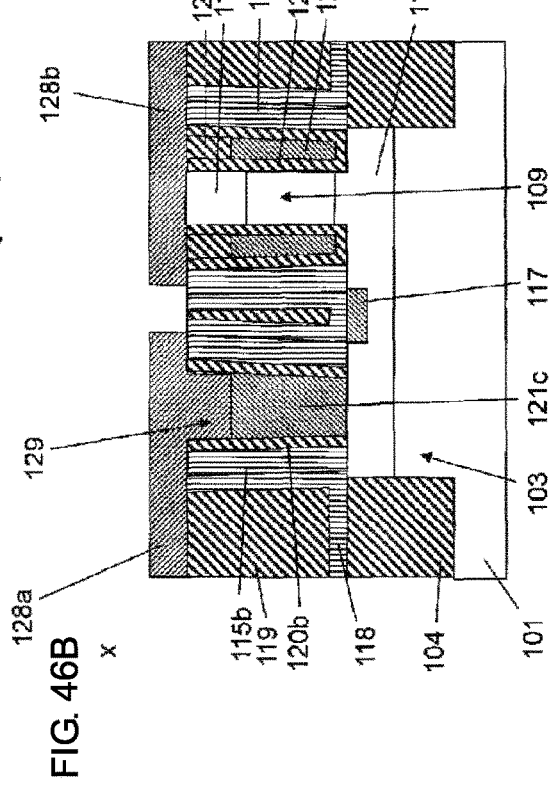
FIG. 46B is a sectional view taken along line X-X' in FIG. 46A.

As illustrated in FIGS. 38A to 38C, a second interlayer insulating film 122 is deposited. As illustrated in FIGS. 39A to 39C, the second interlayer insulating film 122 is planarized to expose the first diffusion layer 112 in an upper portion of the pillar-shaped silicon layer 109. The second interlayer insulating film 122 is divided into second interlayer insulating films 122a and 122b. As illustrated in FIGS. 40A to 40C, a sixth resist 123 for forming contact holes is formed. As illustrated in FIGS. 41A to 41C, the second interlayer insulating films 122a and 122b are etched to form contact holes 124 and 125. As illustrated in FIGS. 42A to 42C, the sixth resist 123 is removed. As illustrated in FIGS. 43A to 43C, a metal 128 is deposited to form second contacts 129 and 131. As illustrated in FIGS. 44A to 44C, seventh resists 132, 133, and 134 for forming metal wires are formed. As illustrated in FIGS. 45A to 45C, the metal 128 is etched to form metal wires 128a, 128b, and 128c. As illustrated in FIGS. 46A to 46C, the seventh resists 132, 133, and 134 are removed. The description so far has shown a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed.

FIGS. 1A to 1C illustrate a structure of the semiconductor device obtained by the above production method.

The semiconductor device includes a fin-shaped silicon layer 103 formed on a silicon substrate 101, a first insulating film 104 formed around the fin-shaped silicon layer 103, a first contact 121c formed on the fin-shaped silicon layer 103, and a gate insulating film 120b formed around the first contact 121c. Since the gate insulating film 120 at the bottom portion of a region where the first dummy contact 113b has been present has been removed, the gate insulating film 120b remains on an inner surface of the fifth insulating film 115b in the region where the first dummy contact 113b has been present. The gate insulating film 120 is a highly insulating film formed by atomic layer deposition, and thus can insulate the first contact 121c from the surrounding structure.

The semiconductor device also includes a pillar-shaped silicon layer 109 formed on the fin-shaped silicon layer 103, a gate insulating film 120a formed around the pillar-shaped silicon layer 109, a gate electrode 121a formed around the gate insulating film 120a and made of a metal, a gate line 121b connected to the gate electrode 121a, extending in a direction perpendicular to a direction in which the fin-shaped silicon layer 103 extends, and made of a metal, a first diffusion layer 112 formed in an upper portion of the pillar-shaped silicon layer 109, and a second diffusion layer 116 formed in an upper portion of the fin-shaped silicon layer 103 and a lower portion of the pillar-shaped silicon layer 109. The upper surface of the gate electrode 121a has a larger area than the lower surface of the gate electrode 121a. The upper surface of the gate line 121b has a larger area than the lower surface of the gate line 121b. Misalignment between the pillar-shaped silicon layer 109 and the gate line 121b can be eliminated because they are formed by self-alignment.

The gate insulating film 120 formed around and at the bottom portions of the gate electrode 121a and the gate line 121b can insulate the gate electrode 121a and the gate line 121b from the pillar-shaped silicon layer 109 and the fin-shaped silicon layer 103.

It should be noted that various other embodiments and modifications can be made without departing from the broad spirit and scope of the present invention, and the above-described embodiments are merely for illustrative purpose only and do not limit the scope of the present invention.

For example, in the above-described embodiments, a method for producing a semiconductor device in which the p-type (including the p$^+$-type) and the n-type (including the n$^+$-type) are each changed to the opposite conductivity type and a semiconductor device produced by the method are naturally within the technical scope of the present invention.

The invention claimed is:

1. A semiconductor device, comprising:
   a fin-shaped semiconductor layer on a semiconductor substrate;
   a first insulating film around said fin-shaped semiconductor layer;
   a first contact directly connected and electrically connected to said fin-shaped semiconductor layer; and
   a first portion of a gate insulating film around and in contact with said first contact.

2. The semiconductor device according to claim 1, wherein an upper surface of said first contact has a common sidewall with a a lower surface of said first contact, and the common sidewall extends at an angle relative to a vertical line, such that said upper surface has a larger area than said lower surface.

3. The semiconductor device according to claim 1, further comprising:
   a pillar-shaped semiconductor layer on said fin-shaped semiconductor layer;
   a second portion of the gate insulating film around said pillar-shaped semiconductor layer;
   a gate electrode around said gate insulating film and made of a metal;
   a gate line connected to said gate electrode, extending in a direction perpendicular to a direction in which said fin-shaped semiconductor layer extends, and made of the metal;

a first diffusion layer in an upper portion of said pillar-shaped semiconductor layer; and a second diffusion layer in the upper portion of said fin-shaped semiconductor layer and a lower portion of said pillar-shaped semiconductor layer, wherein an upper surface of said gate electrode and said gate line each have a common sidewall with a lower surface of said gate electrode and said gate line, respectively, and the common sidewalls extend at an angle relative to a vertical line, such that said upper surfaces have a larger area than said lower surfaces.

4. The semiconductor device according to claim 3, wherein said second portion of the gate insulating film is also around and at bottom portions of said gate electrode and said gate line.

* * * * *